United States Patent [19]
Sato et al.

[11] Patent Number: 6,165,287
[45] Date of Patent: Dec. 26, 2000

[54] FERROMAGNETIC TUNNEL-JUNCTION MAGNETIC SENSOR

[75] Inventors: Masashige Sato; Kazuo Kobayashi; Hideyuki Kikuchi, all of Kawasaki, Japan

[73] Assignee: Fujitsu Limited, Kawasaki, Japan

[21] Appl. No.: 09/371,661

[22] Filed: Aug. 10, 1999

Related U.S. Application Data

[62] Division of application No. 09/047,126, Mar. 24, 1998, Pat. No. 5,986,858.

[30] Foreign Application Priority Data

| Mar. 26, 1997 | [JP] | Japan | 9-074276 |
| Oct. 1, 1997 | [JP] | Japan | 9-268998 |
| Mar. 11, 1998 | [JP] | Japan | 10-060069 |

[51] Int. Cl.[7] .................................................. C23C 08/10
[52] U.S. Cl. ............... 148/276; 148/277; 148/DIG. 118; 148/284
[58] Field of Search .................................. 148/240, 276, 148/284, 277, 285, 708, DIG. 118; 360/113

[56] References Cited

U.S. PATENT DOCUMENTS

| 3,293,085 | 12/1966 | Smith et al. | 148/240 |
| 5,390,061 | 2/1995 | Nakatani et al. | 360/113 |
| 5,650,958 | 7/1997 | Gallagher et al. | 365/173 |
| 5,712,612 | 1/1998 | Lee et al. | 338/32 R |
| 5,729,410 | 3/1998 | Fontana, Jr. et al. | 360/113 |
| 5,862,022 | 1/1999 | Noguchi et al. | 360/113 |

FOREIGN PATENT DOCUMENTS

| 4162207 | 6/1992 | Japan . |
| 4211106 | 8/1992 | Japan . |
| 9106514 | 4/1997 | Japan . |
| 9138919 | 5/1997 | Japan . |
| 10162326 | 6/1998 | Japan . |
| 10162327 | 6/1998 | Japan . |

OTHER PUBLICATIONS

J.S. Moodera and L.R. Kinder; *Journal of Applied Physics*; Proceedings of the 40th Annual Conference on Magnetism and Magnetic Materials; vol. 79, No. 8, pp. 4724–4729; Apr. 15, 1996.

Stanley, "Metallurgy and Magnetism", American Society for Metals, 1949, pp. 88–97.

*Primary Examiner*—John Sheehan
*Assistant Examiner*—Andrew L. Oltmans
*Attorney, Agent, or Firm*—Greer, Burns & Crain, Ltd.

[57] ABSTRACT

A ferromagnetic tunnel-junction magnetic sensor includes a first ferromagnetic layer, an insulation barrier layer formed on the first ferromagnetic layer and including therein a tunnel oxide film, and a second ferromagnetic layer formed on the insulation barrier layer, wherein the insulation barrier layer includes a metal layer carrying the tunnel oxide film thereon such that the tunnel oxide film is formed of an oxide of a metal element constituting the metal layer, and wherein the insulation barrier layer has a thickness of about 1.7 nm or less but larger than 1 molecular layer in terms of the oxide forming the tunnel oxide film.

7 Claims, 24 Drawing Sheets

FERROMAGNETIC TUNNEL-JUNCTION MAGNETIC SENSOR

This is a divisional, of application Ser. No. 09/047,126, filed Mar. 24, 1998, now U.S. Pat. No. 5,986,858.

BACKGROUND OF THE INVENTION

The present invention generally relates to magnetic heads and more particularly to a high-sensitivity magnetic head that uses a so-called ferromagnetic tunnel-junction.

Magnetic heads are used extensively in magnetic storage devices ranging from audio-visual apparatuses such as a video recorder or tape recorder to information processing apparatuses such as a computer. In information processing apparatuses in particular, there is a need for processing a very large amount of information in relation to the processing of image data or audio data, and associated therewith, there is a demand for a large-capacity high-speed magnetic storage device that is capable of recording information with a very large recording density.

The recording density of information that can be read out by a magnetic head, or a resolution limit, is determined primarily by a gap width of the magnetic head and the distance of the magnetic head from the recording medium. In an induction type magnetic head in which a magnetic core is wound around with a coil, a recording density of as much as 65 Mbits/inch$^2$ is achieved when the gap-width is set to 1 $\mu$m. On the other hand, there is a prediction that a magnetic head capable of performing reading and writing with a recording density exceeding 20 Gbits/inch$^2$ is required in future. In order to achieve this, it is essential to provide a super high-sensitivity magnetic sensor that is capable of detecting a very feeble magnetic signal, while such a super high-sensitivity, super high-resolution and super high-speed magnetic sensor cannot be realized by an induction-type magnetic head that operates on the principle of electromagnetic induction.

As a high-sensitivity magnetic head capable of detecting such a very feeble magnetic signal caused by a very minute magnetic recording dot, there is a proposal of using a so-called MR (magneto-resistance) magnetic sensor that uses an anisotropic magneto-resistance or a GMR (giant magneto-resistance) magnetic sensor that uses a giant magneto-resistance, for the magnetic head.

FIG. 1 shows the construction of a typical conventional super high-resolution magnetic read/write head 10 in a cross-sectional view.

Referring to FIG. 1, the magnetic head 10 is constructed on a ceramic substrate 11 typically formed of Al$_2$O$_3$.TiC, and the like, and includes a lower magnetic shield 12 formed on the substrate 11 and an upper magnetic shield 14 formed on the lower magnetic shield 12, with a non-magnetic insulation film 13 interposed between the lower magnetic shield 12 and the upper magnetic shield 14. The upper and lower magnetic shields 12 and 14 form a read gap 15 at a front edge of the magnetic head 10 and a magnetic sensor 16 is disposed in the read gap 15 thus formed.

Further, a magnetic pole 18 is formed on the upper magnetic shield 14, with a non-magnetic insulation film 17 interposed therebetween, and the magnetic pole 18 and the upper magnetic shield 14 form together a write gap 19 at a front edge part of the magnetic head 10. Further, a write coil pattern 17 is formed in the insulation film 12.

In the magnetic head 10 of FIG. 1, the use of various GMR magnetic sensors such as a spin-valve magnetic sensor is proposed for the magnetic sensor 16. A spin-valve magnetic sensor is a magnetic sensor that includes a pinned layer of a ferromagnetic material such as NiFe or Co formed adjacent to an anti-ferromagnetic layer formed of FeMn, IrMn, RhMn, PtMn, PdPtMnN, and the like, and a free layer of a ferromagnetic material such as NiFe or Co is formed in exchange coupling with the pinned layer, with a nonmagnetic layer such as a Cu layer interposed therebetween. It should be noted that the pinned layer has a magnetization fixed by the anti-ferromagnetic layer, while the free layer changes a direction of magnetization in response to an external magnetic field. The pin-valve magnetic sensor changes a resistance thereof in response to the angle formed by the magnetization of the free layer and the magnetization of the pinned layer.

However, such conventional GMR magnetic sensors have a common problem, associated with the structural feature thereof that a non-magnetic layer is formed adjacent to a ferromagnetic layer, that the magnetic head is vulnerable to a heat treatment process. It should be noted that a heat treatment process, typically conducted at a temperature between 250° C. and 300° C., is inevitable in the fabrication process of the magnetic head 10 of FIG. 1.

FIGS. 2A–2E show a typical fabrication process of the magnetic head 10 of FIG. 1.

Referring to FIG. 2A, a thin insulation film corresponding to the write gap 19 is formed on the upper magnetic shield 14 after a magnetic structure including the magnetic sensor 16 and the upper magnetic shield 14 is formed, and a resist pattern 17A is formed further on the foregoing insulation film.

Next, in the step of FIG. 2B, the structure of FIG. 2A is annealed at a temperature of 250–300° C. such that the vertical front edge of the resist pattern 17A undergoes a reflowing. As a result of the reflowing, a curved slope surface is formed in the resist pattern 17A at the foregoing front edge.

Next, in the step of FIG. 2C, the coil pattern 17C is formed on the resist pattern 17A thus annealed, and another resist pattern 17B is formed on the resist pattern 17A so as to bury the coil pattern 17C. Further, an annealing process is applied to the structure of FIG. 2C in the step of FIG. 2D at a temperature of 250–300° C. similarly to the step of FIG. 2B, and a vertical front edge of the resist pattern 17B undergoes a reflowing similarly to the step of FIG. 2B. As a result of the step of FIG. 2D, the resist pattern 17B also has a curved slope surface similarly to the resist pattern 17A.

Next, in the step of FIG. 2E, the magnetic pole 18 is formed on the structure of FIG. 2D.

In the foregoing processes of FIGS. 2A–2E in which resist patterns 17A and 17B experience reflowing after the magnetic sensor 16 is formed, it should be noted that the magnetic sensor 16 experiences the thermal annealing process at the temperature of 250–300° C. twice, in the step of FIG. 2B and in the step of FIG. 2D, while it is known that the GMR magnetic sensor loses most of the large magneto-resistance change, characteristic to a GMR sensor, as a result of such a thermal annealing process. In the case of a spin-valve sensor that uses PtMn or PdPtMnN, and the like for the anti-ferromagnetic layer in particular, it should be noted that a further thermal annealing process is necessary at a temperature of 250° C. or higher in order to crystallize the anti-ferromagnetic layer.

On the other hand, there is a proposal to use a ferromagnetic tunnel-junction magnetic sensor, in which a tunnel insulation film is interposed between a pair of ferromagnetic layers, for the magnetic sensor 16 of the magnetic head 10. A ferromagnetic tunnel junction magnetic sensor is expected to show a very large magneto-resistance change against a feeble magnetic field, even larger than that of a spin-valve GMR sensor, and is thought a promising magnetic sensor for such super high-resolution magnetic head 10.

FIGS. 3A and 3B show the principle of a ferromagnetic tunnel-junction sensor as used for the magnetic sensor 16.

Referring to FIGS. 3A and 3B, the magnetic sensor 16 includes a lower ferromagnetic layer 16A of NiFe or Co and an upper ferromagnetic layer 16B also of NiFe or Co, with a tunnel-insulation film 16C of $AlO_x$ interposed between the layers 16A and 16B with a thickness of several nanometers, and electrons having an upward spin direction and electrons having a downward spin direction are caused to flow through the tunnel-insulation film 16C in the form of a tunnel current, generally perpendicularly to the principal surface thereof.

In the state of FIG. 3A, in which there is no substantial external magnetic field, it can be seen that the direction of magnetization in the ferromagnetic layer 16A and the direction of magnetization in the ferromagnetic layer 16B are in an anti-parallel relationship as a result of exchange interaction established between the ferromagnetic layers 16A and 16B. In contrast, the magnetization in the layer 16A and the magnetization in the layer 16B are parallel in the state of FIG. 3B in which there is an external magnetic field H.

In the ferromagnetic tunnel-junction magnetic sensor of such a construction, it should be noted that the tunnel probability of the electrons changes depending on the magnetization of the upper and lower magnetic layers 16A and 16B, and a tunnel resistance R of the magnetic sensor is changed by the external magnetic field H according to a relationship $$R = R_s + (½) \cdot \Delta R (1 - \cos\theta) \quad (1)$$

wherein Rs represents the tunnel-resistance for a reference state in which the direction of magnetization is parallel in the magnetic layers 16A and 16B, θ represents the angle formed by the magnetization in the magnetic layer 16A and the magnetization in the magnetic layer 16B, and ΔR represents the difference in the tunnel-resistance R between the state in which magnetizations are parallel in the magnetic layers 16A and 16B and in which magnetizations are anti-parallel in the magnetic layers 16A and 16B. It should be noted that ΔR always has a positive value. Thereby, a ratio of tunnel-resistance change or MR ratio is defined as ΔR/R.

As can be understood from Eq. (1), the tunnel-resistance R becomes minimum when the magnetization of the magnetic layer 16A and the magnetization of the magnetic layer 16B are in a parallel relationship as in the case of FIG. 3A. Further, the tunnel-resistance R becomes maximum when the magnetization of the magnetic layer 16A and the magnetization of the magnetic layer 16B are in an anti-parallel relationship as in the case of FIG. 3B.

It should be noted that such a change of magneto-resistance is caused due to the fact that an electron current generally includes both upward electrons having an upward spin direction and downward electrons having a downward spin direction. In a non-magnetic body, the number of the upward electrons and the number of the downward electrons are generally equal and the non-magnetic body does not show magnetism. In the case of a ferromagnetic body, on the other hand, the number of the upward electrons and the number of the downward electrons are different and this is the reason the ferromagnetic body shows magnetism.

When a single electron tunnels through the tunnel insulation film 16C from the ferromagnetic layer 16A to 16B or vice versa, the spin state of the electron is preserved before and after the tunneling This also means that, in order for the electron to tunnel from one ferromagnetic layer to the other ferromagnetic layer successfully, it is necessary that the other ferromagnetic layer includes a vacant state corresponding to the spin state of the foregoing electron. When there is no such a vacant state, the tunneling of the electron does not occur.

It should be noted that the MR ratio ΔR/R of the tunnel resistance is represented as a product of the spin polarization of the electrons in the source ferromagnetic layer 16B and the spin polarization of electrons in the target ferromagnetic layer 16A, according to the relationship $$\Delta R / R = 2 P_1 \cdot P_2 / (1 - P_1 \cdot P_2)$$

wherein $P_1$ and $P_2$ are represented according to the relationship $$P_1, P_2 = 2(N_{UP} - N_{DOWN})/(N_{UP} + N_{DOWN})$$

where $N_{UP}$ represents the number of up-spin electrons or the number of states of the up-spin electrons, while $N_{DOWN}$ represents the number of down-spin electrons or the number of states of the down-spin electrons in the ferromagnetic layer 16A or ferromagnetic layer 16B.

While the value of the spin polarization $P_1$ or $P_2$ generally depends on the ferromagnetic material., there are cases in which an MR ratio of as much as 50% is theoretically predicted when a proper material. system is chosen. This value of the MR ratio is much larger than the MR ratio achieved by a conventional GMR sensor Thus, a ferromagnetic tunnel-junction sensor is thought to be a promising magnetic sensor for use in a super high-resolution magnetic head- See for example the Japanese Laid-Open Patent Publication 4-103014.

Contrary to the foregoing prediction, the MR ratio achieved in conventional ferromagnetic tunnel-junction sensors is far smaller than the foregoing theoretical prediction. In fact, there are only a few examples in which a successful achievement of the MR ratio of 20% is reported (in room temperature environment). Even in such successful examples, there is a tendency that the MR ratio decreases with time or that the device shows a withstand voltage that is too low for reliable detection of the magneto-resistance change. The reason of this unsatisfactory result is thought to be caused by defects that are formed at the interface between the ferromagnetic layer 16A or 16B and the extremely thin tunnel insulation film 16C by a contamination of particles.

Conventionally, it is practiced to form the extremely thin tunnel insulation film 16C by depositing an Al layer on the lower magnetic layer 16A by a sputtering process with a thickness of about 5 nm (50A) and further by applying an oxidation process to convert the deposited Al layer to a layer having a composition of $AlO_x$ (T. Miyazaki and N. Tezuka, J. Magn. Mater. 139, 1995, L231). However, the ferromagnetic tunnel-junction of such a conventional construction has a drawback, associated with the fact; that the non-magnetic Al layer carrying thereon the insulation film 16C has a substantial thickness, that the obtained MR ratio is small.

Further, there has been a problem, in the conventional magnetic head 10 including a ferromagnetic tunnel-junction sensor for the magnetic sensor 16 and fabricated according to the process of FIGS. 2A–2E, in that the foregoing Al layer may cause a reaction with the underlying ferromagnetic layer 16A in the thermal annealing process of FIG. 2B or 2D.

When such a reaction is caused, there occurs a formation of non-magnetic solid solution in the ferromagnetic layer 16A, while the existence of such a non-magnetic region in the ferromagnetic layer 16A deteriorates the MR ratio substantially. Thus, the foregoing conventional ferromagnetic tunnel-junction sensor has suffered from the problem of vulnerability to thermal annealing processes similarly to conventional GMR magnetic sensors.

FIG. 4 shows the magnetization $M_S$ of a structure in which an Al layer is deposited on a Co layer having a thickness of 3 nm, with a thickness of 10 nm, for the case in which the thermal annealing temperature is changed variously.

Referring to FIG. 4, it can be seen that the magnetization Ms decreases with increasing thermal annealing temperature, indicating the occurrence of dissolution of non-magnetic Al atoms into the Co layer from the Al layer.

The result of FIG. 4 indicates that, when a substantial amount of non-magnetic atoms have dissolved from the tunnel insulation film 16C into the underlying ferromagnetic layer 16A in the ferromagnetic tunnel-junction sensor 16 of FIGS. 3A and 3B as a result of the thermal annealing process, the electrons in the upper ferromagnetic layer 16A can cause a tunneling to the lower ferromagnetic layer 16B irrespective of magnetization of the ferromagnetic layer 16B. Thereby, the MR ratio decreases substantially.

In order to improve the heat resistance of the ferromagnetic tunnel-junction sensor, Japanese Laid-Open Patent Publication 4-103013 teaches use of a IIIb–Vb compound for the tunnel insulation film. However, the ferromagnetic tunnel-junction sensor of the foregoing prior art can provide the MR ratio of only 5% at 4.2 K.

SUMMARY OF THE INVENTION

Accordingly, it is a general object of the present invention to provide a novel and useful ferromagnetic tunnel-junction sensor and a fabrication process thereof wherein the foregoing problems are eliminated.

Another and more specific object of the present invention is to provide a ferromagnetic tunnel-junction sensor and a fabrication process thereof in which the ferromagnetic tunnel-junction sensor has an improved resistance to thermal annealing process and shows a large and stable MR ratio.

Another object of the present invention is to provide a ferromagnetic tunnel-junction magnetic sensor, comprising:
  a first ferromagnetic layer;
  an insulation barrier layer formed on said first ferromagnetic layer, said insulation barrier layer including a tunnel oxide film; and
  a second ferromagnetic layer formed on said insulation barrier layer;
  said insulation barrier layer including a metal layer carrying said tunnel oxide film thereon, said tunnel oxide film being formed of an oxide of a metal element constituting said metal layer;
  said insulation barrier layer having a thickness of about 1.7 nm or less, said thickness of said insulation barrier layer being larger than 1 molecular layer in terms of said oxide forming said tunnel oxide film.

Another object of the present invention is to provide a magnetic recording and reproducing apparatus, comprising:
  a magnetic recording medium;
  a magnetic head scanning a surface of said magnetic recording medium;
  said magnetic head including a ferromagnetic tunnel-junction magnetic sensor, comprising: a first ferromagnetic layer; an insulation barrier layer formed on said first ferromagnetic layer, said insulation barrier layer including a tunnel oxide film; and a second ferromagnetic layer formed on said insulation barrier layer; said insulation barrier layer including a metal layer carrying said tunnel oxide film thereon, said tunnel oxide film being formed of an oxide of a metal element constituting said metal layer; said insulation barrier layer having a thickness of about 1.7 nm or less, said thickness of said insulation barrier layer being larger than 1 molecular layer in terms of said oxide forming said tunnel oxide film.

Another object of the present invention is to provide a method of fabricating a ferromagnetic tunnel-junction magnetic sensor, said ferromagnetic tunnel-junction magnetic sensor including a first ferromagnetic layer, an insulation barrier layer including a tunnel oxide film and formed on said first ferromagnetic layer, and a second ferromagnetic layer formed on said insulation barrier layer, said method comprising the steps of:
  depositing a metal layer on said first ferromagnetic layer with a thickness of about 1.7 nm or less such that said metal layer has a thickness larger than one molecular layer in terms of an oxide of a metal forming said metal layer;
  forming said tunnel oxide film on said metal layer by oxidizing a surface of said metal layer; and
  forming said second ferromagnetic layer on said oxidized surface of said metal layer.

According to the present invention, the deterioration of spin polarization in the insulation barrier layer is suppressed effectively by reducing the thickness of the non-magnetic metal layer used for a starting material when forming the insulation barrier layer to about 1.7 nm or less. As a result of the successful suppression of deterioration of the spin polarization or improvement in conservation of spin state of the electrons before and after the tunneling, the magnetic sensor of the present invention shows an improved MR ratio. By forming the thickness of the non-magnetic metal layer to be larger than one molecular layer in terms of the oxide layer of the non-magnetic metal layer, the problem of short circuit of the tunnel oxide film is avoided successfully.

By using a metal element in which the bonding energy to oxygen is larger than that of the metal element forming the underlying ferromagnetic layer, for the foregoing non-magnetic layer, the non-magnetic metal layer absorbs oxygen from the underlying ferromagnetic layer when a heat treatment is applied at the temperature of 200° C.–300° C., preferably at about 300° C. Thereby, the spin polarization in the ferromagnetic layer is improved further and the MR ratio of the magnetic sensor is improved further. In addition, the magnetic sensor of the present invention has an improved thermal resistance in view of the foregoing improvement of performance as a result of the thermal annealing process. Thus, the magnetic sensor of the present invention experiences little degradation of performance even when the reflowing of a resist film is conducted in the fabrication process of a magnetic head that includes the ferromagnetic tunnel-junction magnetic-sensor. Further, the magnetic sensor of the present invention experiences little degradation of performance even when a thermal annealing process is applied to an anti-ferromagnetic layer formed above the upper ferromagnetic layer for pinning the magnetization of the upper ferromagnetic layer.

Other objects and further features of the present invention will become apparent from the following detailed description when read in conjunction with the attached drawings.

DETAILED DESCRIPTION OF THE PREFERRED EMBODIMENTS

PRINCIPLE

Figure 5A:
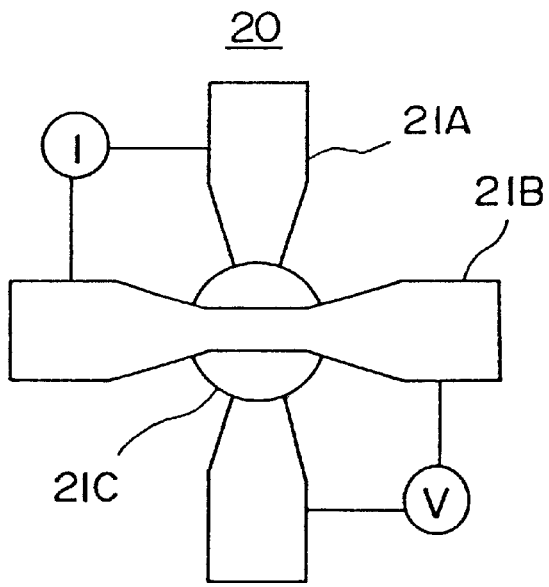
FIGS. 5A and 5B are diagrams explaining the principle of the ferromagnetic tunnel-junction magnetic sensor of the present invention.
Figure 5B:
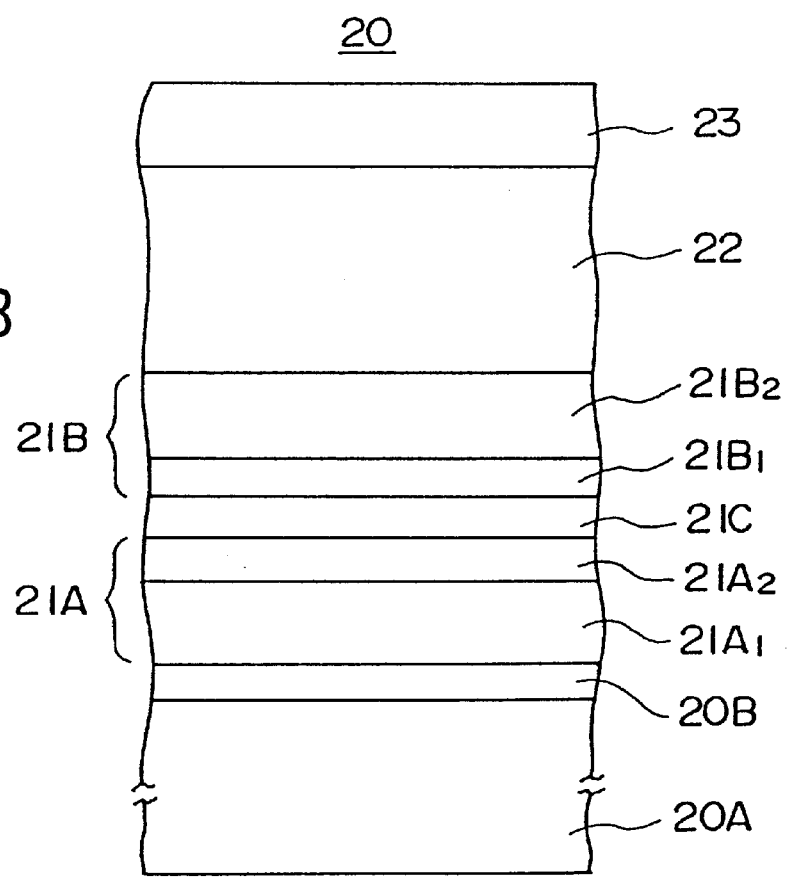

FIGS. 5A and 5B are diagrams showing a ferromagnetic tunnel-junction 20 used in the present invention for a magnetic sensor or a magnetic head respectively in a plan view and in a cross-sectional view.

Figure 3A:
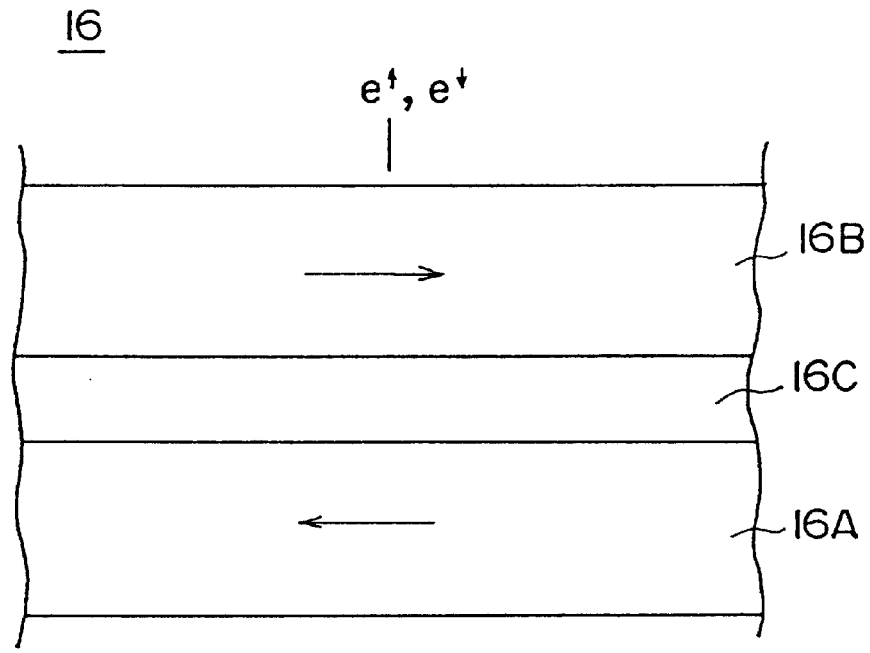
FIGS. 3A and 3B are diagrams explaining the principle of a conventional ferromagnetic tunnel junction sensor.
Figure 3B:
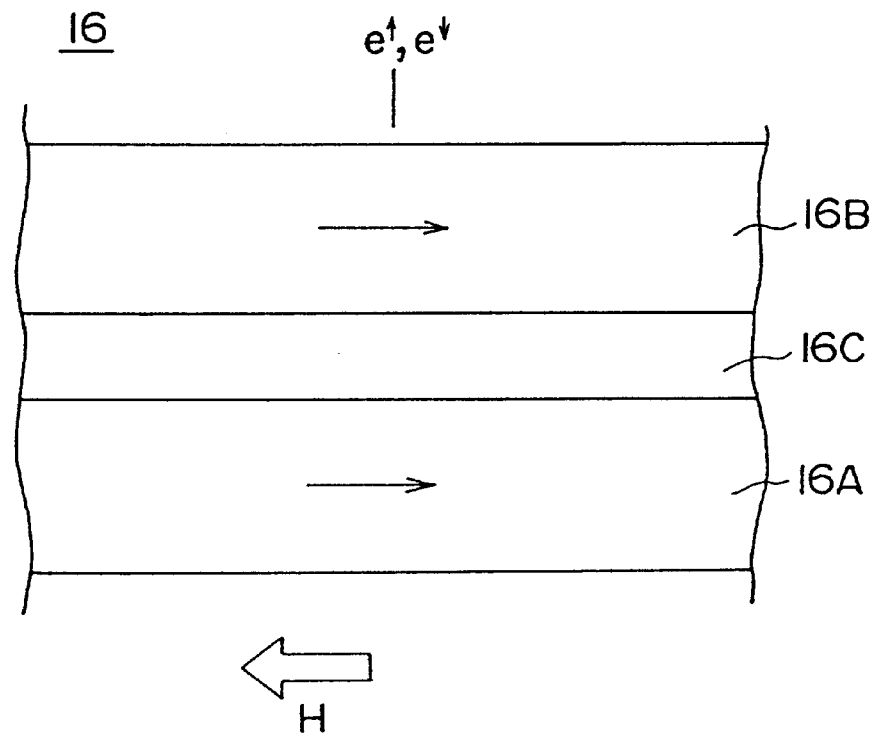

Referring to FIG. 5B first, the ferromagnetic tunnel-junction 20 is formed on a Si substrate 20A covered by an $SiO_2$ film 20B and includes a lower ferromagnetic layer 21A corresponding to the ferromagnetic layer 16A of FIGS. 3A and 3B, wherein the lower ferromagnetic layer 21A includes a NiFe layer $21A_1$ having a thickness of 17.1 nm and a Co layer $21A_2$ formed on the NiFe layer $21A_1$ with a thickness of 3.3 nm. On the lower ferromagnetic layer 21A, an insulation barrier layer 21C corresponding to the insulation barrier layer 16C of FIGS. 3A and 3B is formed, and an upper ferromagnetic layer 21B corresponding to the ferromagnetic layer 16B of FIGS. 3A and 3B is formed on the insulation barrier layer 21C, wherein the upper ferromagnetic layer 21B includes a Co layer $21B_1$ having a thickness of 3.3 nm and a NiFe layer $21B_2$ formed on the Co layer $21B_1$ with a thickness of 17.1 nm. Further, an anti-ferromagnetic layer 22 is formed on the FeNi layer $21B_2$ for pinning the direction of magnetization of the upper ferromagnetic layer 21B, and another FeNi layer 23 is formed on the FeMn layer 22 with a thickness of 8.6 nm.

Referring to the plan view of FIG. 5A, the lower ferromagnetic layer 21A and the upper ferromagnetic layer 21B form respective conductive strips crossing each other in the plan view of FIG. 5A, wherein the foregoing insulation barrier layer 20C is formed at the intersection of the two conductive strips. Further, the FeMn layer 22 and the NiFe layer 23 thereon are patterned in conformity with shape of the underlying upper ferromagnetic layer 21B.

As indicated in FIG. 5A, a drive current is caused to flow between the lower ferromagnetic layer 21A and the upper ferromagnetic layer 21B across the insulation barrier layer 21C by a current source, and a tunnel resistance of the insulation barrier layer 21C is detected by detecting a voltage difference appearing across the ferromagnetic layers 21A and 21B. It should be noted that the magnetization direction of the ferromagnetic layer 21B is fixed by the anti-ferromagnetic layer 22 while the direction of magnetization of the ferromagnetic layer 21A changes freely in response to an external magnetic field. In response to the change of direction of the magnetization of the ferromagnetic layer 21A, the ferromagnetic tunnel-junction 20 changes the resistance thereof.

Figure 6:
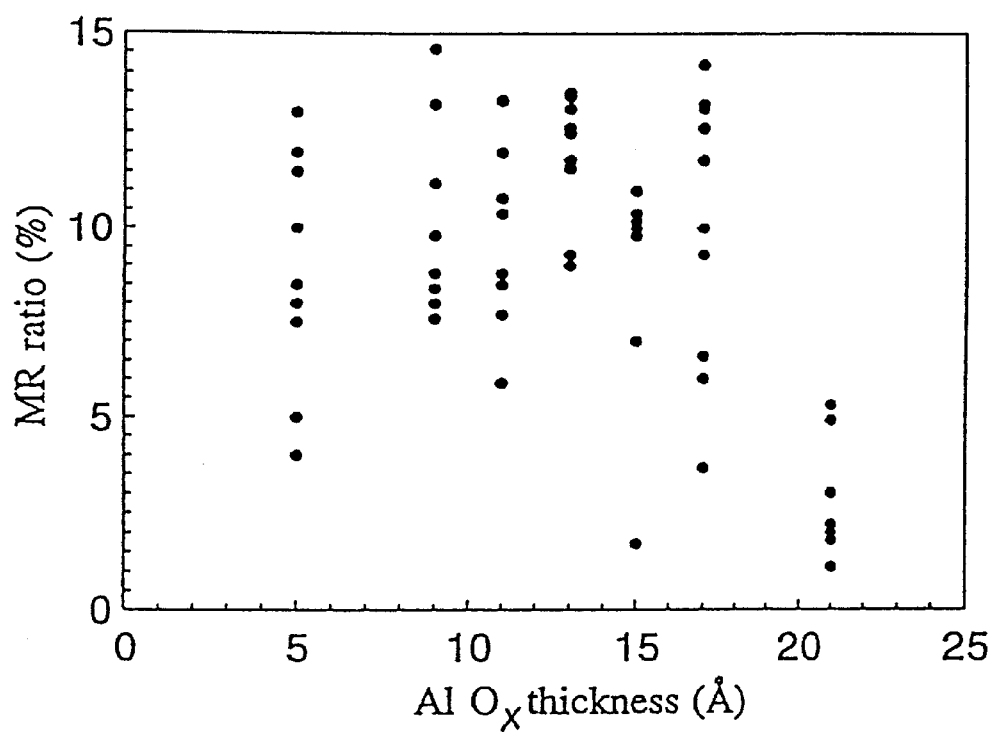
FIG. 6 is another diagram explaining the principle of the ferromagnetic tunnel-junction magnetic sensor of the present invention.

FIG. 6 shows the MR ratio of the ferromagnetic tunnel-junction 20 of FIGS. 5A and 5B for a case in which the insulation barrier layer 20C is formed of an Al film deposited on the ferromagnetic layer 20A with various thicknesses so as to carry thereon a tunnel oxide film formed as a result of natural oxidation of the Al film.

Referring to FIG. 6, the Al film 21C carrying thereon a native $Al_2O_3$ film has a composition generally represented by $AlO_x$, wherein it can be seen that a large MR ratio of about 10–15% is achieved for the ferromagnetic tunnel-junction 20 when the thickness of the Al film 21C is in the range of about 0.5 nm–1.7 nm. It should be noted that the foregoing native $Al_2O_3$ film is formed typically by applying a natural oxidation process to the surface of the Al film 21C for a duration of 100 hours or more. When the duration of the natural oxidation process is less than 100 hours, there is a tendency that a short circuit occurs in the $Al_2O_2$ film due to incomplete formation of the $Al_2O_3$ film.

When the thickness of the foregoing $Al_2O_3$ native oxide film exceeds 1.7 nm and reaches 2.1 nm, on the other hand, the MR ratio drops sharply to 5% or less. It is believed that this undesirable effect is caused by the degradation of spin polarization occurring in the electrons flowing through the Al film 21C now having an increased film thickness. When the thickness of the Al film 21C is reduced below 0.5 nm (5 Å) corresponding to the thickness of 1 molecular layer in terms of $Al_2O_3$, the formation of the native $Al_2O_3$ film becomes unstable and there appears a problem that the tunnel junction tends to cause a short-circuit, as mentioned above. Thus, from the foregoing experimental results and considerations, it is concluded that the thickness of the insulation barrier layer 21C is preferably be set to be larger than about 0.5 nm but smaller than about: 1.7 nm.

It should be noted that the experimental result of FIG. 6 also indicates that the obtained MR ratio scatters substantially. In view of this observed scattering of the MR value, the inventor of the present invention has conducted a thermal annealing process to the ferromagnetic tunnel-junction 20 at various temperatures in a vacuum environment and measured the MR ratio.

Figure 7:
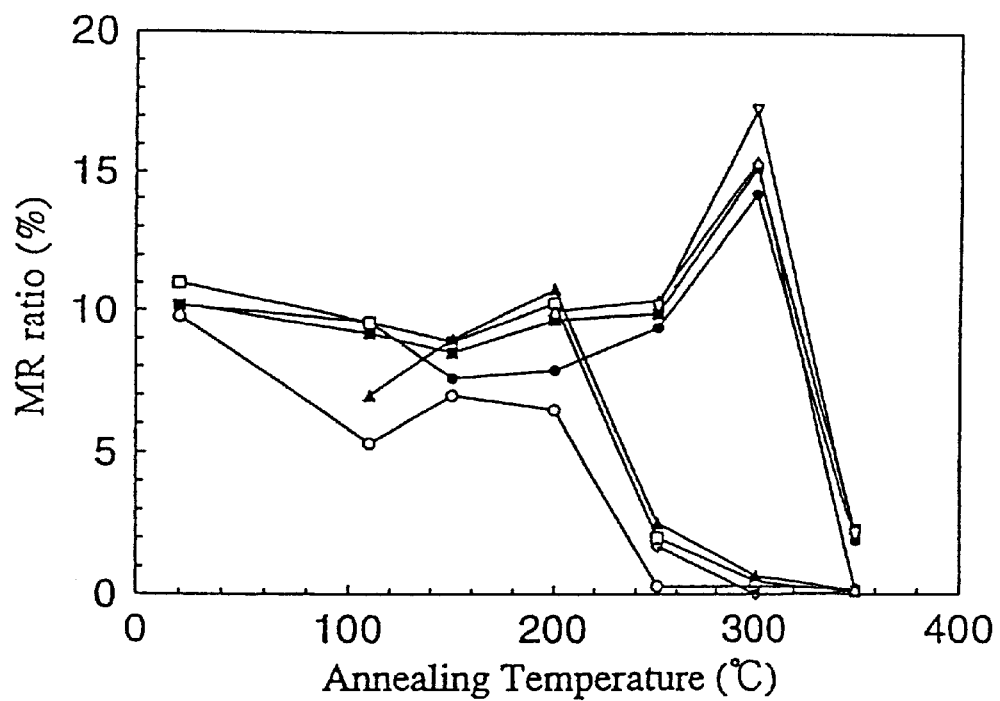
FIG. 7 is a further diagram explaining the principle of the ferromagnetic tunnel-junction magnetic sensor of the present invention.

FIG. 7 shows the MR ratio of the ferromagnetic tunnel-junction 20 thus annealed at various temperatures indicated in FIG. 7 under the pressure of $1 \times 10^{-5}$ Torr for a duration of about 1 hour.

Referring to FIG. 7, it can be seen that most of the tested tunnel-junctions show an MR ratio of 5–10% when the temperature of the thermal annealing process is in the range from room temperature to 200° C. When the temperature of the thermal annealing process is set to a range of 200° C.–300° C., on the other hand, it was observed that a part of the tested tunnel-junctions show an increased value for the MR ratio in the range of 15–20%, while the other of the tested tunnel-junctions showed a decrease of the MR ratio to almost 0%.

Further, a conduction test applied to those ferromagnetic tunnel-junction test pieces that showed the foregoing increase of the MR ratio as a result of the thermal annealing process, has revealed that the occurrence of failure is only 2% after ten days of driving with a drive current of 5 mA. When the same conduction test is applied to those ferromagnetic tunnel-junction test pieces that showed the decrease of the MR ratio, on the other hand, it was observed that the proportion of failed test pieces reaches as much as 32% after ten days. The foregoing result means that the test pieces that showed the decrease of the MR ratio already included potential defects even at the time of formation of the tunnel-junction and that such a thermal annealing process is effective for both enhancing the performance of the ferromagnetic tunnel-junctions and rejecting potentially defective tunnel-junctions.

Figure 8A:
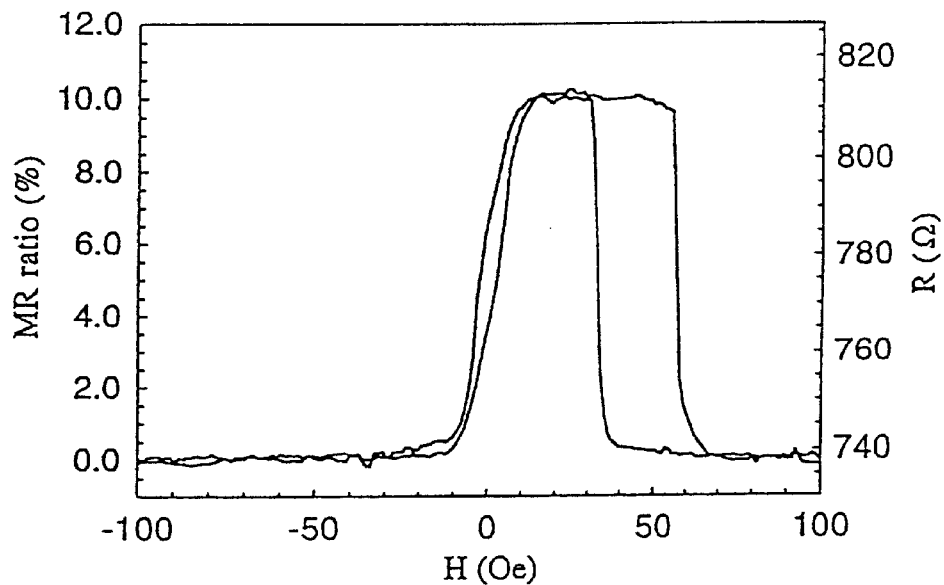
FIGS. 8A and 8B are further diagrams explaining the principle of the ferromagnetic tunnel junction magnetic sensor of the present invention.

FIG. 8A shows the change of the magneto-resistance R of the ferromagnetic tunnel-junction 20 not subjected to the foregoing thermal annealing process, for the case in which an external magnetic field H is applied and changed from −100 Oe to +100 Je and from +100 Oe to −100 Oe, wherein the vertical axis at the left represents the resistivity of the tunnel-junction 20 while the vertical axis at the right represents a corresponding MR ratio. It should be noted that two curves indicated in FIG. 8A respectively correspond to the cases in which the external magnetic field H is increased from −100 Oe to +100 Oe and decreased from +100 Oe to −100 Oe. Referring to FIG. 8A, it can be seen that an MR ratio of about 10–11% is achieved for the ferromagnetic tunnel-junction 20 not subjected to the thermal annealing process.

Figure 8B:
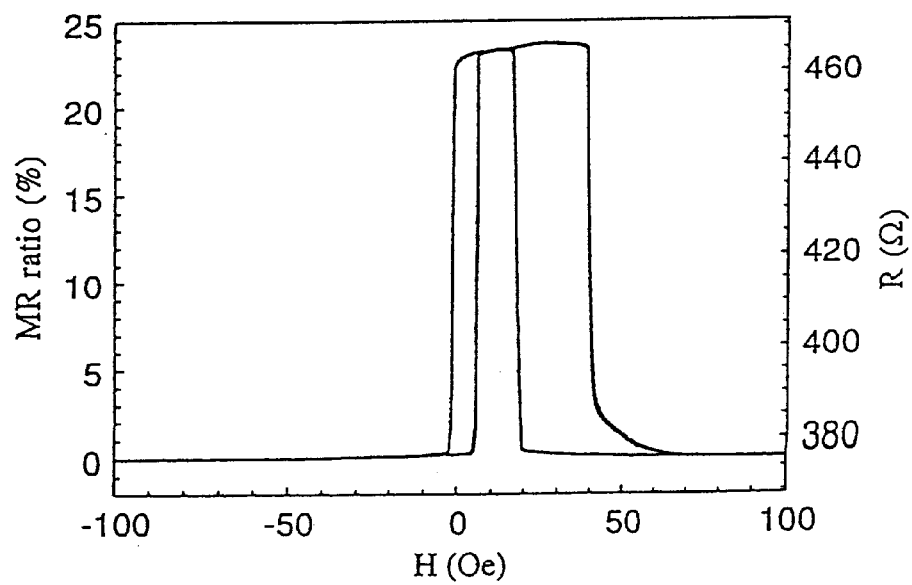

FIG. 8B shows the change of the magneto-resistance R of the ferromagnetic tunnel-junction 20 that is subjected to the thermal annealing process at 300° C. Similarly to FIG. 8A, FIG. 8B shows the magneto-resistance R for both cases in which the external magnetic field H is increased from −100 Oe to +100 Oe and decreased from +100 Oe to −100 Oe by two curves Referring to FIG. 8B, it can be seen that the MR ratio now reaches a value of 23–24%, which is twice as large as the MR ratio for the case of FIG. 8A.

The improvement of the MR ratio discovered in the experiments of FIG. 7 or FIGS. 8A and 8B of the present invention is exactly opposite to what is expected conventionally. It is believed that this unexpected result is caused by the mechanism explained below with reference to FIGS. 9A and 9B Referring to FIG. 9A, the Co layer $21A_2$ forming a part of the lower ferromagnetic layer 21A generally carries a very thin, non-magnetic native oxide film of Co on the surface thereof. Such a native oxide film of Co may be formed when the Co layer $21A_2$ is formed by a sputtering process. It should be noted that the formation of such a native Co oxide film is inevitable when a sputtering mask used for forming the Co layer $21A_2$ with a desired shape in the sputtering process thereof is replaced by another sputtering mask for depositing the insulation barrier layer 21C by a further sputtering process.

When an Al metal layer is formed on such a Co layer $21A_2$ as the insulation barrier layer 21C and the surface of the layer 21C is oxidized by a natural oxidation process to convert the composition to $AlO_x$, it should be noted that the metal Al still remains in the bottom part of the layer 21C and makes a direct contact with the native Co oxide formed at the surface of the underlying Co layer $21A_2$.

Figure 9A:
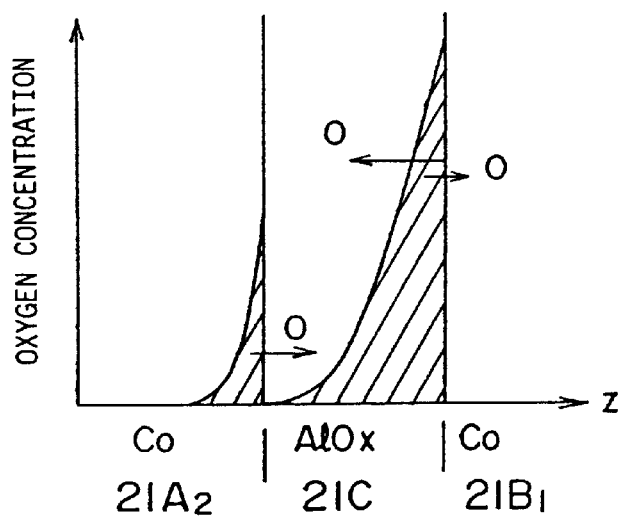
FIGS. 9A and 9B are further diagrams explaining the principle of the ferromagnetic tunnel-junction magnetic sensor of the present invention.
Figure 9B:
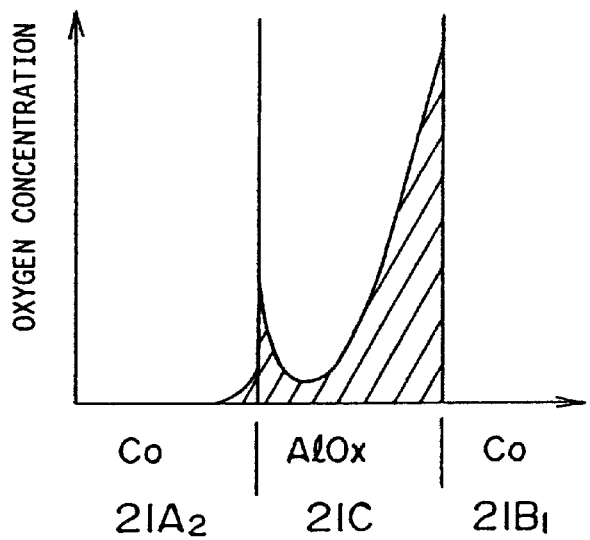

When the ferromagnetic tunnel-junction 20 including therein such a contact structure is subjected to the thermal annealing process at the temperature of 200° C.–300° C., it is believed that the oxygen atoms in the Co native oxide film is absorbed by the Al layer 21C due to the larger bonding energy of oxygen to Al than the bonding energy of oxygen to Co as indicated by arrows in FIG. 9A, and the concentration of oxygen atoms in the Co layer $21A_2$ is decreased as indicated in FIG. 9B. Associated with this, the oxygen concentration in the layer 21C is thought to increase at the bottom part of the layer 21C. As the oxygen concentration in the Co layer $21A_2$ is decreased at the surface part thereof, the problem of degradation of spin polarization of the electrons flowing through the native oxide film of the Co layer $21A_2$ is successfully suppressed. It is believed that this is the reason why the MR ratio of the tunnel-junction 20 is improved as a result of the thermal annealing process.

In order to achieve such a transport of oxygen atoms in the ferromagnetic tunnel-junction 20, it is essential that the metallic Al makes a contact with the surface of the Co layer 21B, that carries a native oxide layer or an oxygen enriched layer. While it is noted that another Co layer $21B_1$ is formed on the insulation barrier layer 21C in the ferromagnetic tunnel-junction 20, the transport of oxygen atoms from the layer 21 having an oxygen enriched composition ($Al_2O_3$) at the top surface thereof to the Co layer $21B_2$ does not occur substantially due to the larger bonding energy of oxygen to Al than the bonding energy of oxygen to Co.

Further, by setting the initial thickness of the layer 21C to be less than 1.7 nm in such a thermal annealing process in accordance with the discovery of FIG. 6, the entire layer 21C is oxidized and the problem of deterioration of spin polarization caused by the metallic Al remaining in the layer 21C is effectively suppressed.

Figure 10:
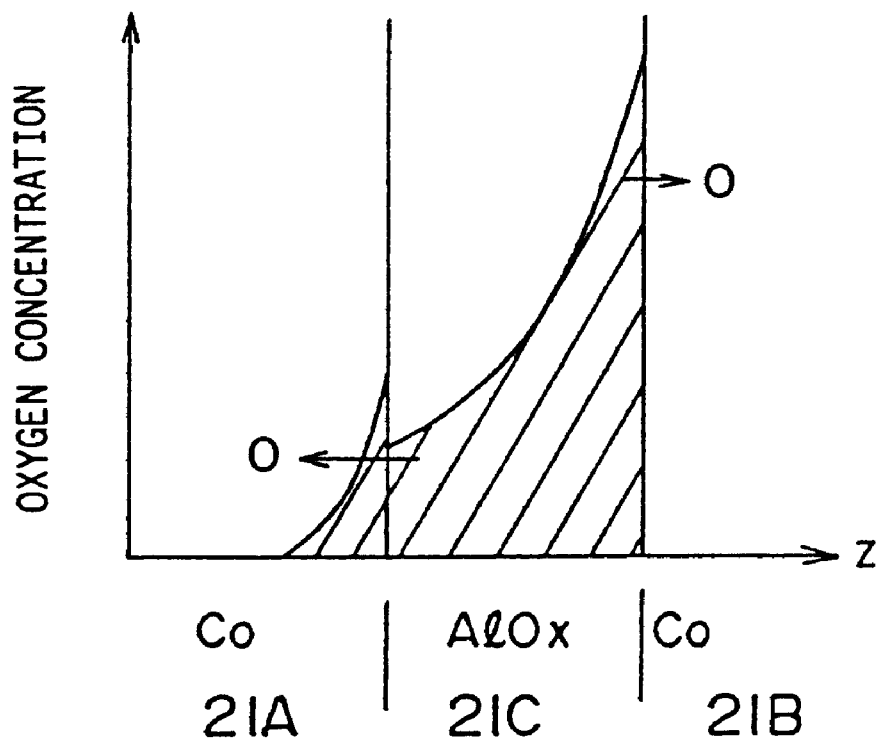
FIG. 10 is a further diagram explaining the principle of the ferromagnetic tunnel-junction magnetic sensor of the present invention.

When the entire insulation barrier layer 21C is oxidized before the thermal annealing process as indicated in FIG. 10, on the other hand, the oxygen atoms in the layer 21C may penetrate into the Co layer $21A_2$ underneath as a result of the thermal annealing process and the magnetic property of the Co layer $21A_2$ may be deteriorated.

Further, when the temperature of the thermal annealing process is excessively-high, there is a risk that the Al atoms may cause a diffusion into the adjacent Co layer $21A_2$ or $21B_1$ and cause a solid solution formation therein. When such a solid solution of Co and Al is formed, the magnetic property of the Co layer $21A_2$ or $21B_1$ is deteriorated.

FIRST EMBODIMENT

Figure 11:
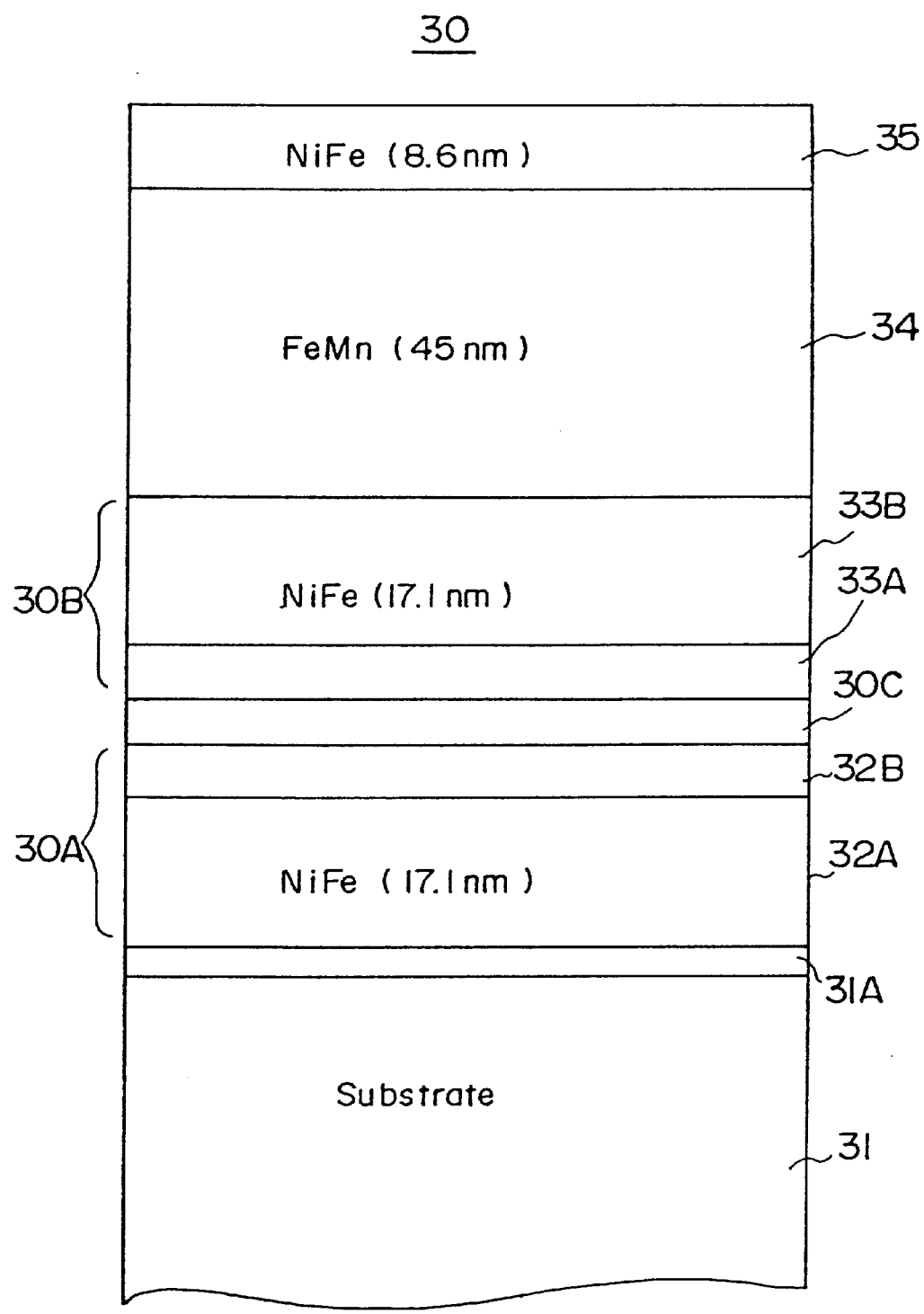
FIG. 11 is a diagram showing the construction of a ferromagnetic tunnel-junction magnetic sensor according to a first embodiment of the present invention.

FIG. 11 shows the construction of a ferromagnetic tunnel-junction magnetic sensor 30 according to a first embodiment of the present invention.

Referring to FIG. 11, the ferromagnetic tunnel-junction magnetic sensor 30 has a construction similar to that of the ferromagnetic tunnel-junction 20 described previously and is formed on a Si substrate 31 covered by an $SiO_2$ film 31A having a thickness of about 3 nm, wherein the magnetic sensor 30 includes a lower ferromagnetic layer 30A formed of a NiFe ferromagnetic layer 32A having a thickness of 17.1 nm and a Co ferromagnetic layer 32B formed on the NiFe ferromagnetic layer 32A with a thickness of 3.3 nm. On the lower ferromagnetic layer 31A, an insulation barrier layer 30C corresponding to the insulation barrier layer 21C of FIG. 5B is formed, and an upper ferromagnetic layer 30B corresponding to the ferromagnetic layer 21B of FIG. 5B is formed on the insulation barrier layer 30C, wherein the upper ferromagnetic layer 30B includes a Co ferromagnetic layer 33A having a thickness of 3.3 nm and a NiFe ferromagnetic layer 33B formed on the Co ferromagnetic layer 33A with a thickness of 17.1 nm. Further, an anti-ferromagnetic layer 34 of FeMn is formed on the FeNi ferromagnetic layer 33B for pinning the direction of magnetization of the upper ferromagnetic layer 30B, and another FeNi ferromagnetic layer 35 is formed on the FeMn anti-ferromagnetic layer 34 with a thickness of 8.6 nm.

It should be noted that the NiFe ferromagnetic layer 32A and the Co ferromagnetic layer 32B are formed on the $SiO_2$ film 31A consecutively by a sputtering process, while the insulation barrier layer 30C is formed by depositing a metallic Al layer on the Co ferromagnetic layer 32B by a sputtering process, followed by a natural oxidation process to oxidize the surface of the metallic Al layer thus formed for a duration of about 100 hours or more. As a result of the natural oxidation process of the metallic Al layer, a tunnel oxide film of $Al_2O_3$ is formed at the surface part of the insulation barrier layer 30C.

After the insulation barrier layer 30C is thus formed, the Co ferromagnetic layer 33A and the NiFe ferromagnetic layer 33B are deposited on the layer 30C consecutively by a sputtering process to form the upper ferromagnetic layer 30B, and the FeMn anti-ferromagnetic layer 34 and the NiFe ferromagnetic layer 35 are deposited consecutively on the NiFe ferromagnetic layer 33B. By using a suitable sputtering mask at the time of the sputtering process, it is possible to form the magnetic sensor 30 in an arbitrary planar shape such as the one shown in the plan view of FIG. 5A.

It should be noted the Co layer 33A or 32B is provided on the NiFe layer 32A or 33B for improving the spin polarization of the electrons passing through the ferromagnetic layer 30A or 30B and entering the insulation barrier layer 30C. When forming the lower ferromagnetic layer 30A, it should be noted that the sputtering process of the magnetic layers 32A and 32B is conducted under existence of an external magnetic field acting perpendicularly to the plane of drawing of FIG. 11. Further, the sputtering process of the magnetic layers 33A and 33B for forming the upper ferromagnetic layer 30B is conducted under existence of an external magnetic field acting from left to right or from right to left in the plane of drawing of FIG. 11.

As explained with reference to FIG. 8A, the ferromagnetic tunnel-junction magnetic sensor 30 of FIG. 11 thus formed shows an MR ratio exceeding 10% in the as-formed state On the other hand, the MR ratio is increased up to 20% or more, by applying a thermal annealing process to the as-formed magnetic sensor 30 in a vacuum environment at the temperature of 200–300° C. as explained with reference to FIG. 8B.

When the magnetic sensor 30 is applied with the thermal annealing process at the temperature of 200–300° C., it is also possible, in addition to the foregoing advantageous feature of increasing the MR ratio, to use a PdPtMn alloy for the anti-ferromagnetic layer 34 in place of FeMn. While a PdPtMn alloy cannot create a magnetic field with a magnitude sufficient to cause the desired pinning of the ferromagnetic layers 33A and 33B when the thermal annealing process is conducted at a temperature of about 200° C. or less, the thermal annealing process conducted at the temperature of about 300° C. or more successfully induces a formation of a CuAu-type I ordered lattice structure in the crystal structure of the alloy, while the ordered lattice structure thus formed creates the pinning magnetic field with a magnitude of as much as 2000 e sufficient for causing the pinning of the ferromagnetic layers 33A and 33B. The formation of the ordered lattice structure is confirmed by X-ray diffraction analysis. It should be noted that the alloy of PdPtMn system has long been recognized as a promising material for the pinning layer in the art of spin-valve GMR magnetic sensors because of the potential of creating a very large magnetic field suitable for exchange coupling, while the use of this promising material has been unsuccessful in the conventional GMR magnetic sensors due to the need of thermal annealing process that has to be conducted at the temperature of at least about 300° C. In the ferromagnetic tunnel-junction magnetic sensor 30 of the present embodiment, this promising material can be used without problem due to the improved temperature resistance to thermal annealing processes conducted at the temperature exceeding 300° C.

Figure 12:
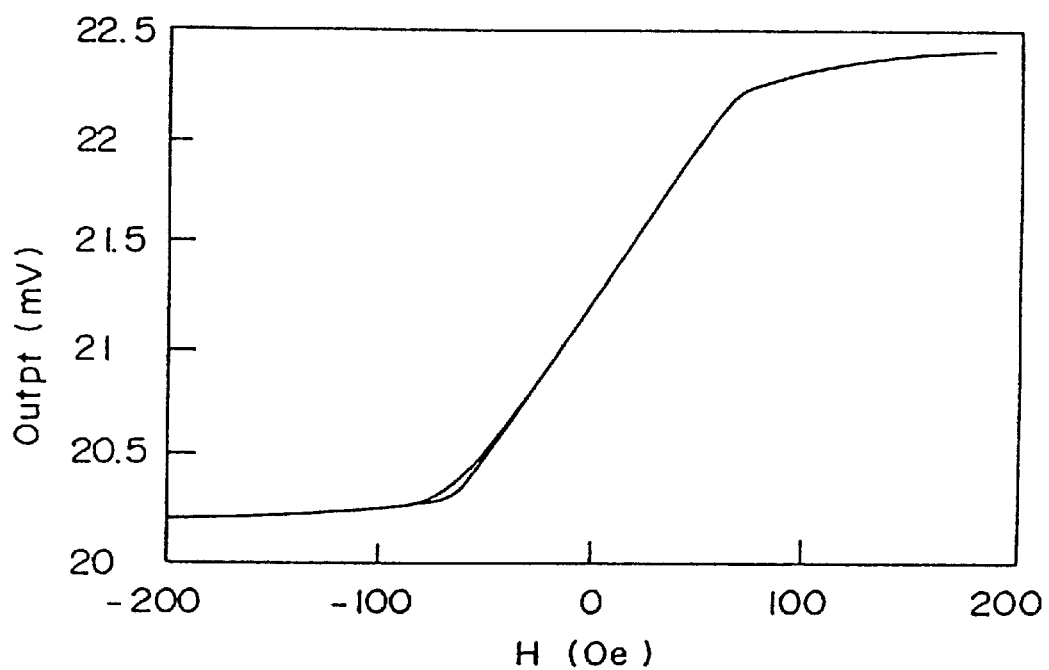
FIG. 12 is a diagram showing the operational characteristic of the ferromagnetic tunnel-junction magnetic sensor of FIG. 11.

FIG. 12 shows the magnetic detection performance of the ferromagnetic tunnel-junction magnetic sensor 30 of the present embodiment.

Referring to FIG. 12, it can be seen that the magnetic sensor 30 can produce a voltage output of as much as 2 mV for the change of external magnetic field of ±600 e.

Meanwhile, it should be noted that the tunnel oxide film formed on the insulation barrier layer 30C is by no means limited to a native oxide film of Al but includes also a plasma oxide film formed by a plasma oxidation process.

Figure 13:
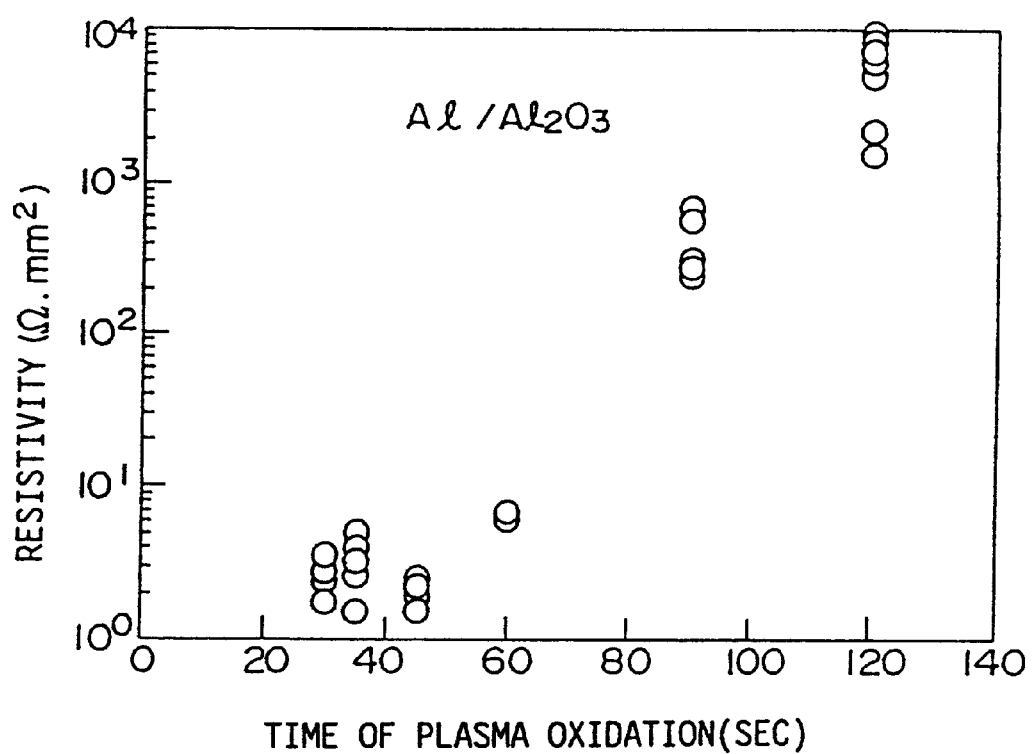
FIG. 13 is a diagram showing the tunnel resistance of the ferromagnetic tunnel-junction magnetic sensor for the case in which a tunnel oxide film is formed by a plasma oxidation process.

FIG. 13 shows the resistivity of the insulation barrier layer 30C for the case in which a tunnel oxide film of $Al_2O_3$ is formed on the surface of the underlying Al layer by a plasma oxidation process.

Referring to FIG. 13, it can be seen that the tunnel oxide film is formed with a thickness that allows a substantial tunnel current to flow therethrough when the duration of the plasma oxidation process is set within about 60 seconds. When the duration of the plasma oxidation process is extended further, on the other hand, the thickness of the tunnel oxide film becomes excessive and the tunnel resistance is increased unwantedly.

Figure 14:
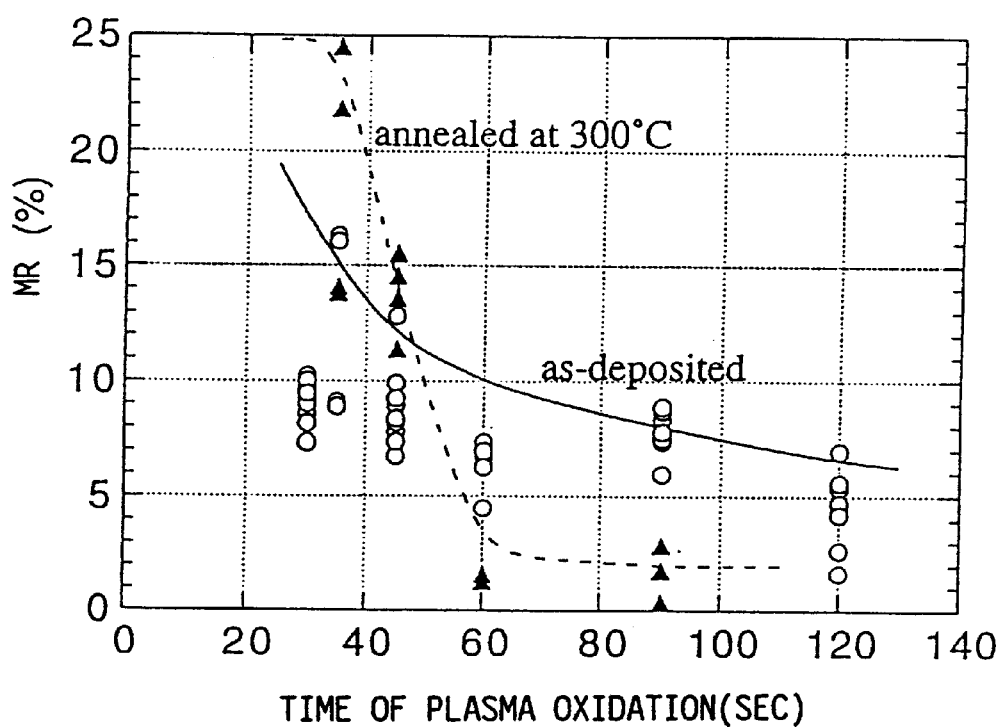
FIG. 14 is a diagram showing the change of the MR ratio of the ferromagnetic tunnel-junction magnetic sensor of FIG. 11 having a tunnel oxide film of FIG. 13 for the case in which a thermal annealing process is conducted.

FIG. 14 shows the relationship between the duration of the plasma oxidation process and the MR ratio for the case in which the $Al_2O_3$ tunnel oxide film is formed by a plasma oxidation process.

Referring to FIG. 14, it can be seen that the MR ratio of the magnetic sensor 30 becomes 10–15% when no thermal annealing process is applied and the duration of the plasma oxidation is set to about 40 seconds. When the plasma oxidation process is conducted for a duration of 120 seconds, on the other hand, the MR ratio is reduced to 1–7%. In the event a thermal annealing process of 300° C. is conducted, on the other hand, the MR ratio can be increased to 20–25% when the plasma oxidation process is conducted for a duration of 40 seconds. When the duration of the plasma oxidation process is increased further the MR.. ratio of the magnetic sensor 30 drops sharply and is reduced to only 1–5% when the plasma oxidation process is conducted for more than 60 seconds The result of FIG. 14 indicates that the entire Al layer forming the insulation barrier layer 30C is oxidized when the plasma oxidation process is conducted for a prolonged duration exceeding 40 seconds and that the oxygen atoms penetrate from the insulation barrier layer 30C into the underlying Co ferromagnetic layer 32B as a result of the thermal annealing process thus conducted at a high temperature such as about 300° C. When the duration of the plasma oxidation process is limited within about 40 seconds, on the other hand, it is believed a metallic Al layer remains at the bottom part of the insulation barrier layer 30C substantially and the transport of oxygen atoms occurs from the surface region of the Co ferromagnetic layer 32B to the remaining metallic Al layer in the insulation barrier layer 30C when such a thermal annealing process is conducted.

SECOND EMBODIMENT

As explained already with reference to FIGS. 9A and 9B, the problem of deterioration of the magnetic property of the lower ferromagnetic layer, more specifically the problem of deterioration of the spin polarization of the lower ferromagnetic layer, caused by the existence of oxide on the surface of the lower ferromagnetic layer, is successfully compensated for by applying the thermal annealing process to the ferromagnetic tunnel-junction magnetic sensor, provided that a metallic Al layer remains in the bottom part of the insulation barrier layer.

This, on the other hand, means also that a thin oxide film may be interposed between the lower ferromagnetic layer and the insulation barrier layer, provided that the insulation barrier layer contains a metallic Al layer at the bottom part thereof. It should be noted that such a thin oxide film can be used for a diffusion barrier for preventing mutual diffusion of Al in the insulation barrier layer and Co in the lower ferromagnetic layer. When the use of such a diffusion barrier layer is possible, the fabrication of the ferromagnetic tunnel-junction sensor of the present invention becomes substantially facilitated.

Figure 15:
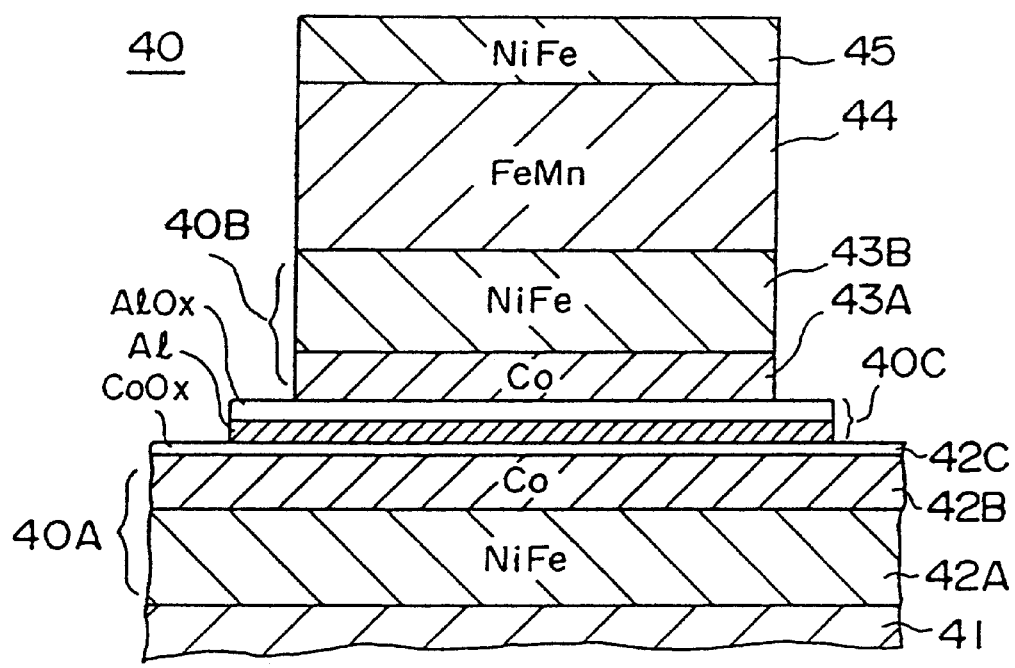
FIG. 15 is a diagram showing the construction of a ferromagnetic tunnel-junction magnetic sensor according to a second embodiment of the present invention.

FIG. 15 shows the construction of a ferromagnetic tunnel-junction magnetic sensor 40 according to a second embodiment of the present invention.

Referring to FIG. 15, the ferromagnetic tunnel-junction magnetic sensor 40 of the present embodiment has a construction similar to that of the ferromagnetic tunnel-junction 30 of the previous embodiment and is formed on a Si substrate 41 covered by an $SiO_2$ film (not shown), wherein the magnetic sensor 40 includes a lower ferromagnetic layer 40A formed of a NiFe ferromagnetic layer 42A having a thickness of 17.1 nm and a Co ferromagnetic layer 42B formed on the NiFe ferromagnetic layer 42A with a thickness of 3.3 nm. On the Co ferromagnetic layer 42B, a diffusion barrier layer 42C of Co oxide is formed, and an insulation barrier layer 40C corresponding to the insulation barrier layer 30C of FIG. 11 is formed on the diffusion barrier layer 42C. Further, an upper ferromagnetic layer 40B corresponding to the ferromagnetic layer 30B of FIG. 11 is formed on the insulation barrier layer 40C, wherein the upper ferromagnetic layer 40B includes a Co ferromagnetic layer 43A having a thickness of 3.3 nm and a NiFe ferromagnetic layer 43B formed on the Co ferromagnetic layer 43A with a thickness of 17.1 nm. Further, an anti-ferromagnetic layer 44 of FeMn is formed on the FeNi ferromagnetic layer 43B for pinning the direction of magnetization of the upper ferromagnetic layer 40B, and another FeNi ferromagnetic layer 45 is formed on the FeMn anti-ferromagnetic layer 44 with a thickness of 8.6 nm.

In the present embodiment, too, the NiFe ferromagnetic layer 42A and the Co ferromagnetic layer 42B or the NiFe ferromagnetic layer 43A and the Co ferromagnetic layer 43B are formed by a sputtering process, while the insulation barrier layer 40C is formed by depositing a metallic Al layer by a sputtering process with a thickness of about 1.3 nm, followed by a natural oxidation process or plasma oxidation process applied to the surface of the metallic Al layer similarly to the previous embodiment. As a result of the natural oxidation process of the metallic Al layer, a tunnel oxide film of $Al_2O_3$ is formed at the surface part of the insulation barrier layer 40C.

Further, the Co oxide film 42C forming the diffusion barrier layer is also formed in the present embodiment by any of natural oxidation process, thermal oxidation process or plasma oxidation process of the surface of the Co ferromagnetic layer 42B. When the diffusion barrier layer 42C is formed by a natural oxidation process, the surface of the Co layer 42B may be exposed to an oxygen atmosphere for a duration of about 1 hour. The Co oxide film thus formed is not limited to those having a stoichiometric composition represented by CoO but also includes the compound having a non-stoichiometric composition represented generally as $CoO_x$.

After the insulation barrier layer 40C is thus formed, the Co ferromagnetic layer 43A and the NiFe ferromagnetic layer 43B are deposited on the layer 40C consecutively by a sputtering process to form the upper ferromagnetic layer 40B, and the FeMn anti-ferromagnetic layer 44 and the NiFe ferromagnetic layer 45 are deposited consecutively on the NiFe ferromagnetic layer 43B. By using a suitable sputtering mask at the time of the sputtering process, it is possible to form the magnetic sensor 40 in an arbitrary planar shape such as the one shown in the plan view of FIG. 5A.

It should be noted the Co layer 43A or 42B is provided on the NiFe layer 42A or 43B for improving the spin polarization of the electrons passing through the ferromagnetic layer 40A or 40B and entering the insulation barrier layer 40C. When forming the lower ferromagnetic layer 40A, it should be noted that the sputtering process of the magnetic layers 42A and 42B is conducted under existence of an external magnetic field acting perpendicularly to the plane of drawing of FIG. 15. Further, the sputtering process of the magnetic layers 43A and 43B for forming the upper ferromagnetic layer 40B is conducted under existence of an external magnetic field acting from left to right or from right to left in the plane of drawing of FIG. 15.

In the magnetic sensor 40 of the present embodiment, the problem of mutual diffusion of Al atoms and Co atoms between the Co layer 42B and the metallic Al layer, included in the insulation barrier layer 40C, is effectively avoided by providing the Co oxide diffusion barrier layer 40C on the surface of the Co layer 42B. Thereby, the yield of production of the magnetic sensor 40 is improved substantially particularly when the fabrication process of the magnetic sensor 40 includes the thermal annealing process.

Figure 16:
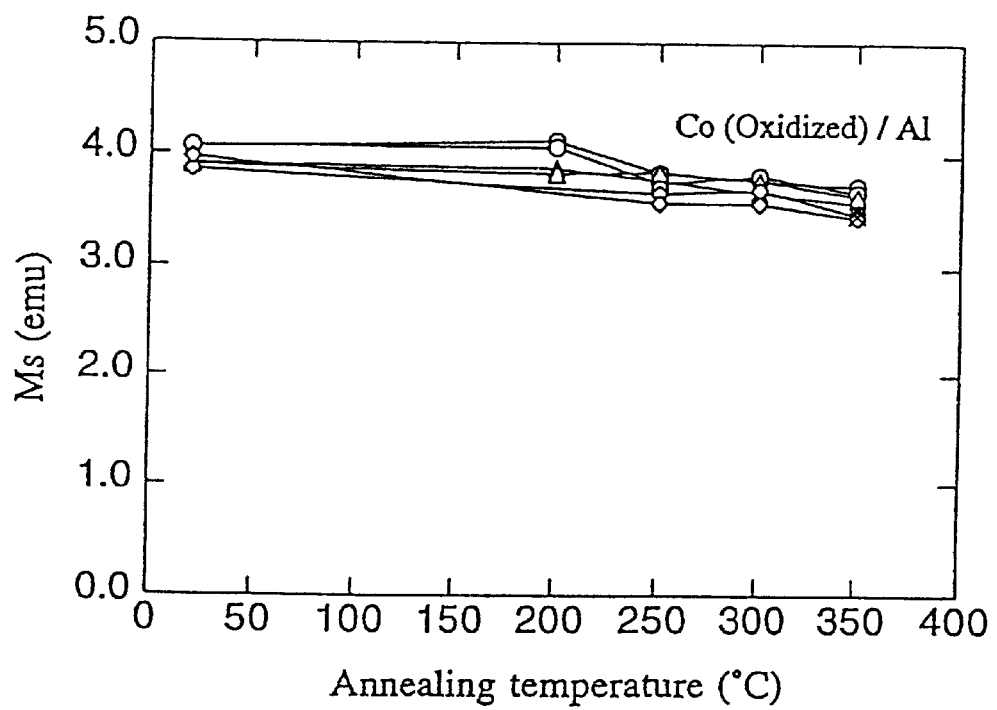
FIG. 16 is a diagram showing the effect of diffusion barrier layer provided in the ferromagnetic tunnel-junction magnetic sensor of FIG. 15.

FIG. 16 shows the magnetization Ms of a Co layer carrying thereon an Al layer with an intervening Co oxide film formed on the surface of the Co layer by a natural oxidation process, for a case in which a thermal treatment is applied to the foregoing structure with a temperature in the range of 50–350° C.

Figure 4:
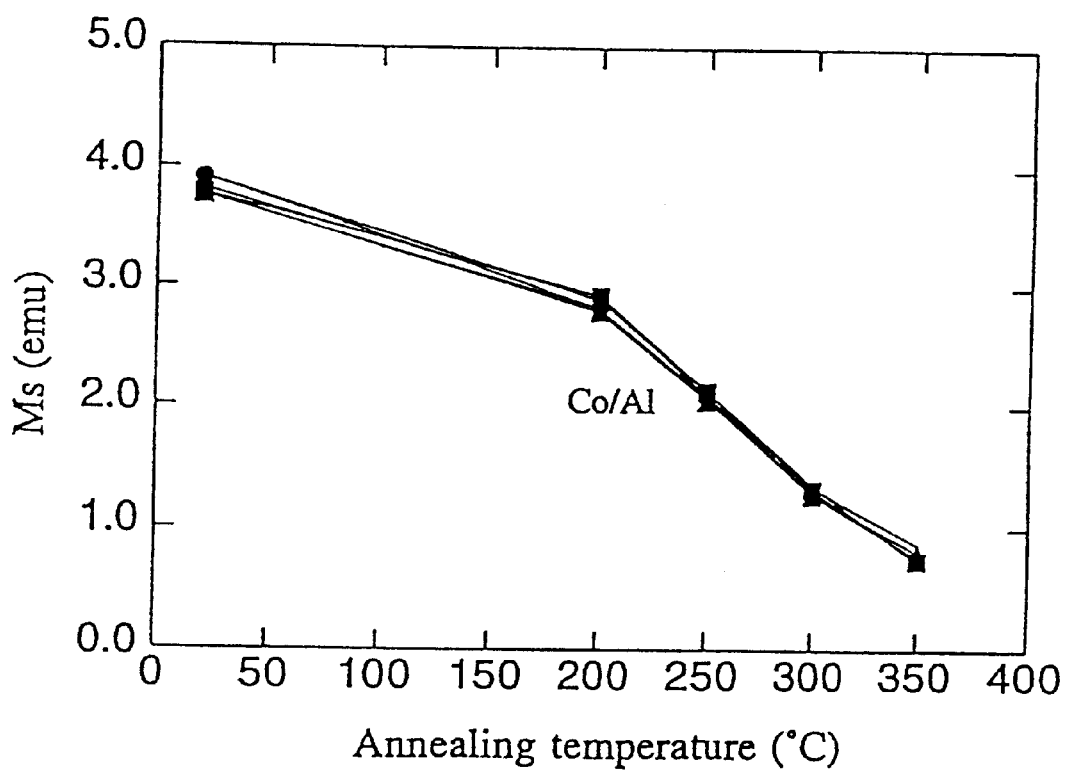
FIG. 4 is a diagram explaining the problem of mutual diffusion of metals occurred in the conventional ferromagnetic tunnel-junction sensor.

Referring to FIG. 16, it can be seen clearly that the magnetization $M_S$ of the Co layer changes little even when the foregoing thermal annealing process is applied to the structure and that the problem of mutual diffusion of the Co atoms and Al atoms as in the case of FIG. 4, in which a Co layer and an Al layer are contacted directly, is successfully avoided.

In the structure of FIG. 15, there is a concern, in view of the structural feature of the magnetic sensor 40 that the CoO layer 42C is added between the ferromagnetic layer 42B and the ferromagnetic layer 43A further to the insulation barrier layer 40C, in that the spin polarization of the electrons may be degraded as a result of the addition of the non-magnetic CoO layer 42C. When such a degradation of spin polarization occurs, the MR ratio of the magnetic sensor 40 would be decreased unwantedly. In order to avoid this problem, the magnetic sensor 40 of the present embodiment sets the thickness of the Al layer used for the formation of the insulation barrier layer 40C to be less than about 1.7 nm, preferably less than about 1.3 nm.

It is also expected that the CoO layer 42C thus added in the structure of FIG. 15 decreases the thickness thereof or vanishes at all when the thermal annealing process is applied as a result of the transport of oxygen to the metallic Al layer as explained with reference to FIGS. 9A and 9B or FIG. 14. When such a diminishing of thickness or total vanishing of the CoO layer 42C occurs, an increase, not decrease, of the MR ratio as explained with reference to FIG. 14 is observed also in the magnetic sensor 40 of FIG. 15. In fact, the relationship of FIG. 7 explained before is obtained for the structure in which a native oxide film is formed on the CoO layer 21A₂ in correspondence to the film 42C of FIG. 15 as a result of exposure of the CoO layer 21A₂ to the air when changing the sputtering mask.

Thus, the ferromagnetic tunnel-junction magnetic sensor 40 of FIG. 15 is capable of suppressing the mutual diffusion of Al and Co between the insulation barrier layer 40C and the underlying Co layer 42B, and simultaneously maximizing the MR ratio, by forming the CoO film 42C on the Co layer 42B and by applying a thermal annealing process at the temperature of 200–300° C.

THIRD EMBODIMENT

Figure 17:
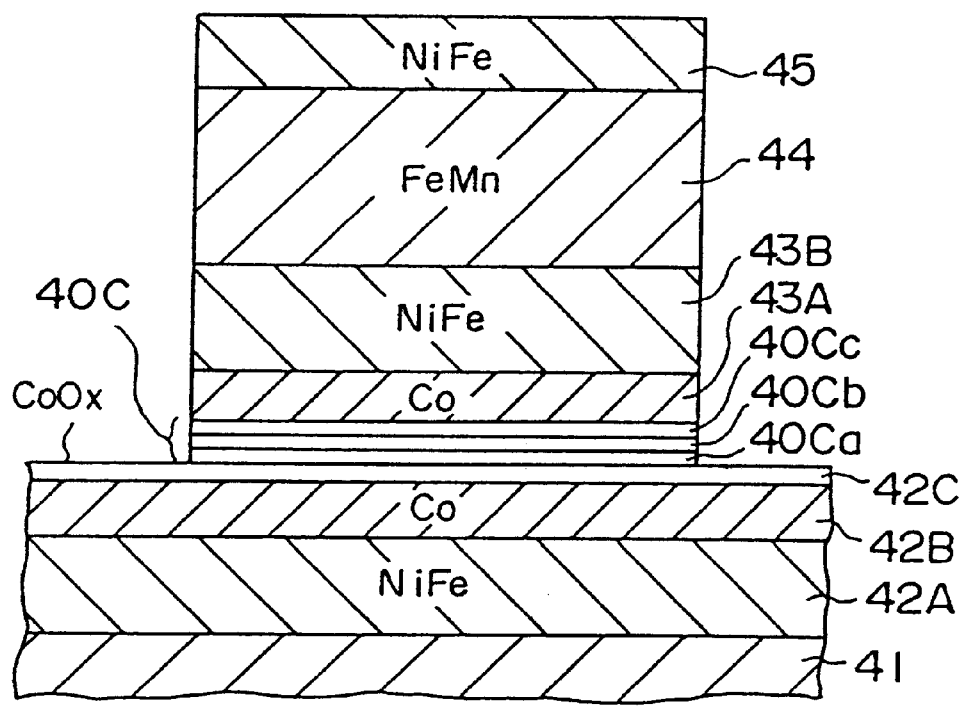
FIG. 17 is a diagram showing the construction of a ferromagnetic tunnel-junction magnetic sensor according to a third embodiment of the present invention.

FIG. 17 shows the construction of a ferromagnetic tunnel-junction magnetic sensor 50 according to a third embodiment of the present invention, wherein those parts corresponding to the parts described previously are designated by the same reference numerals and the description thereof will be omitted.

Referring to FIG. 17, the present invention replaces the insulation barrier layer 40C by a plurality of insulation barrier layers 40Ca–40Cc, wherein each of the insulation barrier layers 40Ca–40Cc has a thickness of 0.4 nm or less and a composition of $AlO_x$ and is formed as a result of deposition of Al film and oxidation.

In the present embodiment, the interior of the insulation barrier layer 40C is converted to $AlO_x$ by forming the layer 40C in the form of plural layers 40Ca–40Cc. Thereby, the problem of degradation of spin polarization caused by the metallic Al layer remaining inside the insulation barrier layer 40C is successfully minimized.

It should be noted that the foregoing insulation barrier layers 40Ca–40Cc are not necessarily required to have the same composition but may have respective, different compositions. For example, the layers 40Ca and 40Cc may be formed of $AlO_x$ and the layer 40Cb may be formed of $NbO_x$. Further, the number of the layers 40Ca–40Cc is not limited to three but may be two or four or more.

FOURTH EMBODIMENT

Figure 18A:
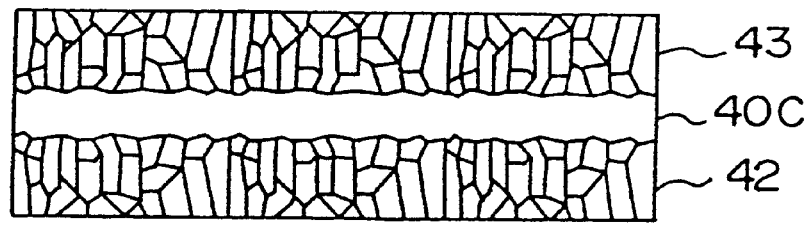
FIGS. 18A and 18B are diagrams showing the problem of grain growth and related problems that occur when a thermal annealing process is applied to a ferromagnetic tunnel-junction magnetic sensor.

In the ferromagnetic tunnel-junction sensor 40 of FIG. 15, it is preferable to conduct a thermal annealing process at the temperature of 200–300° C. On the other hand, such a thermal annealing process may invite a grain growth in the ferromagnetic layers 42 and 43 sandwiching the intervening insulation barrier layer 40C shown in FIG. 18A and the structure of FIG. 18A may change to a coarse-grained structure shown in FIG. 18B after the thermal annealing process. In the coarse-grained structure of FIG. 18B, it should be noted that a coarse crystal grain in the layer 42 may contact a coarse crystal grain in the layer 43, and there occurs a short-circuit in the tunnel-junction. It is believed that this is one of the possible reasons of the defects explained with reference to the thermal annealing process of FIG. 7.

Figure 19:
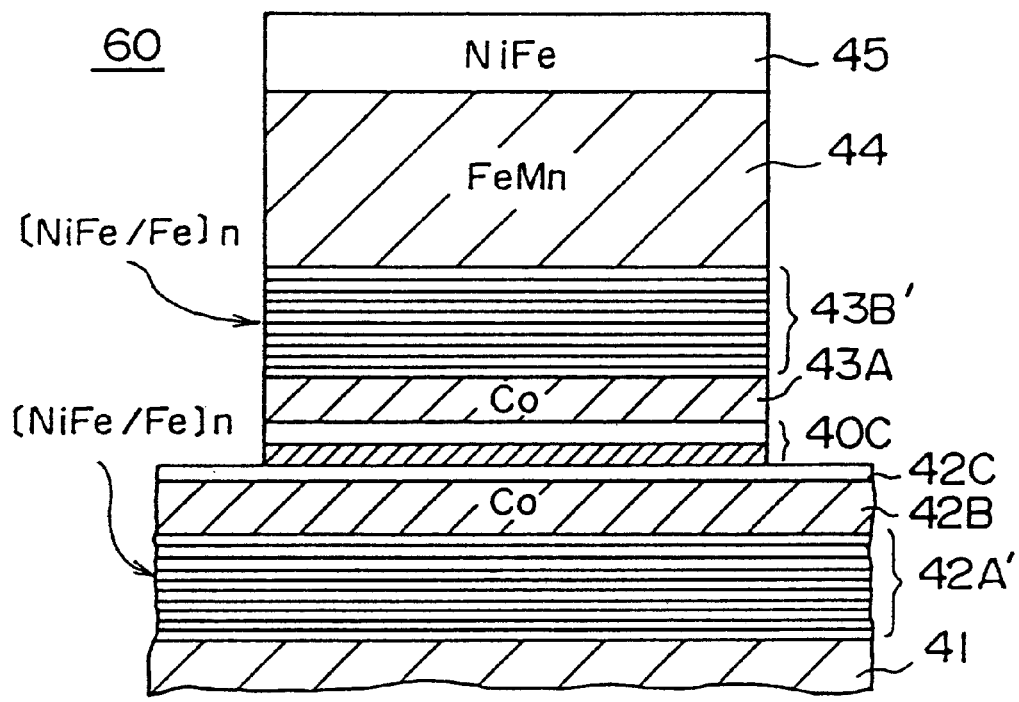
FIG. 19 is a diagram showing the construction of a ferromagnetic tunnel-junction magnetic sensor according to a fourth embodiment of the present invention.

In the present embodiment, a ferromagnetic tunnel-junction magnetic sensor 60 of FIG. 19 is proposed wherein the foregoing problem is eliminated. In FIG. 19, it should be noted that those parts corresponding to the parts described previously are designated by the same reference numerals and the description thereof will be omitted.

Referring to FIG. 19, the ferromagnetic layers 42A and 43B of FIG. 15 are replaced by layers 42A' and 43B' respectively, wherein a NiFe layer having a thickness of about 2 nm and a Fe layer having a thickness of about 2 nm are stacked alternately in each of the layers 42A' and 43B'. In the illustrated example, the NiFe layer and the Fe layer are repeated five times in each of the layers 42A' and 43A'.

Figure 18B:
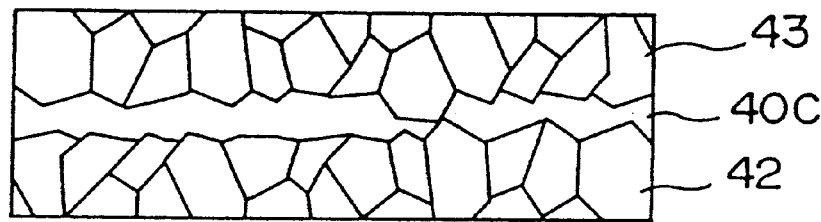
Figure 20A:
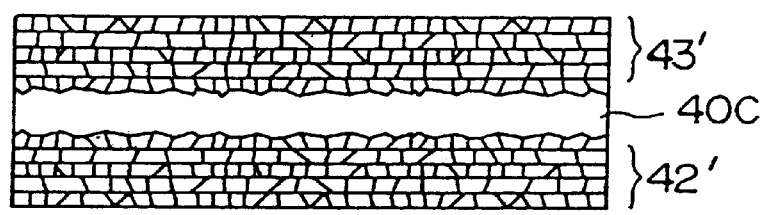
FIGS. 20A and 20B are diagrams showing the effect of suppression of grain growth achieved by the ferromagnetic tunnel-junction magnetic sensor of FIG. 19.
Figure 20B:
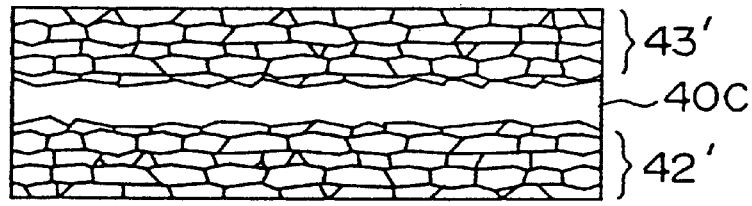

In such a layered structure, the grain growth is effectively suppressed as indicated in FIGS. 20A and 20B respectively representing the state before and after the thermal annealing process, and the problem of the short-circuit of the tunnel junction explained with reference to FIG. 18B is successfully eliminated As a result of such a stacked construction of the layers 42A' and 43A', the ferromagnetic tunnel-junction sensor 60 can be produced with an improved yield even when the thermal annealing process at 200–300° C. is included in the fabrication process of the magnetic sensor

FIFTH EMBODIMENT

Figure 21:
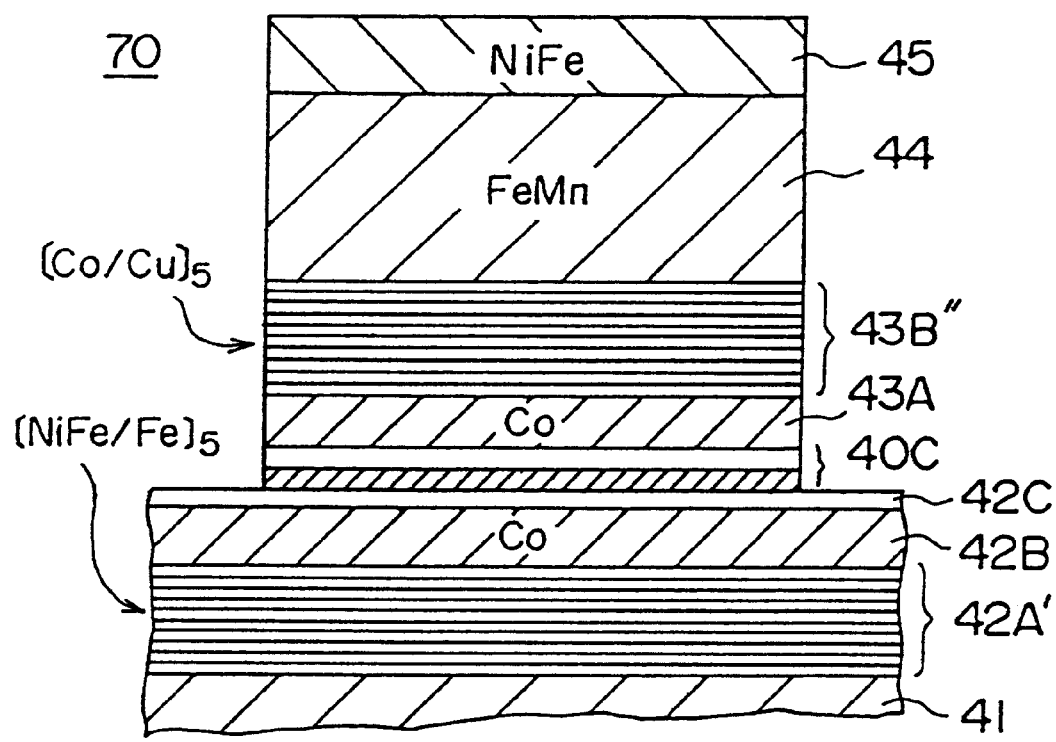
FIG. 21 is a diagram showing the construction of a ferromagnetic tunnel-junction magnetic sensor according to a fifth embodiment of the present invention.

FIG. 21 shows the construction of a ferromagnetic tunnel-junction magnetic sensor 70 according to a fifth embodiment of the present invention, wherein those parts corresponding to the parts described previously are designated by the same reference numerals and the description thereof will be omitted.

Referring to FIG. 21, the magnetic sensor 70 has a construction similar to that of the magnetic sensor 60 of FIG. 19, except that the ferromagnetic layer 43B' having the NiFe/Ni stacked structure explained before is now replaced by a ferromagnetic layer 40B" having a Co/Cu stacked structure in which a Co layer having a thickness of about 1.5 nm and a Cu layer having a thickness of about 1.0 nm are stacked alternately.

In the ferromagnetic layer 40B" having such a stacked structure, it should be noted that there develops an anti-ferromagnetic exchange interaction between the ferromagnetic Co layer and the non-magnetic Cu layer. Thereby, the direction of magnetization in the layer 43B" is fixed by the anti-ferromagnetic layer 44 provided adjacent to the layer 43B", while the layer 43B" determines the direction of magnetization of the Co ferromagnetic layer 43A underneath. By forming the ferromagnetic layer 40B" to have the foregoing stacked structure, the grain growth in the layer 40B" is successfully suppressed similarly to the grain growth explained with reference to FIGS. 20A and 20B and the problem of short-circuit of the tunnel-junction is avoided even when a thermal annealing process is applied to the magnetic sensor.

SIXTH EMBODIMENT

Figure 22A:
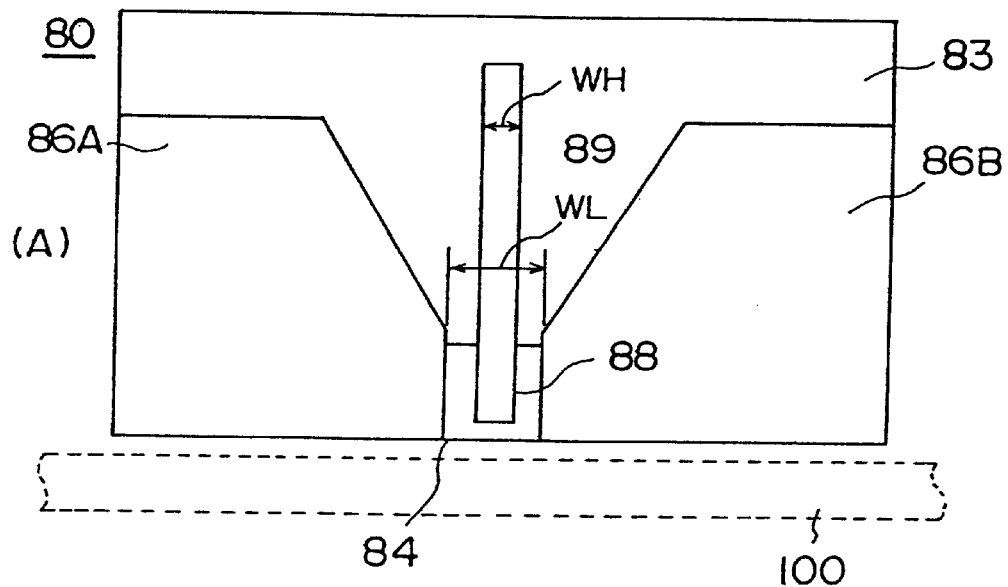
FIGS. 22A and 22B are diagrams showing the construction of a ferromagnetic tunnel-junction magnetic sensor according to a fifth embodiment of the present invention.
Figure 22B:
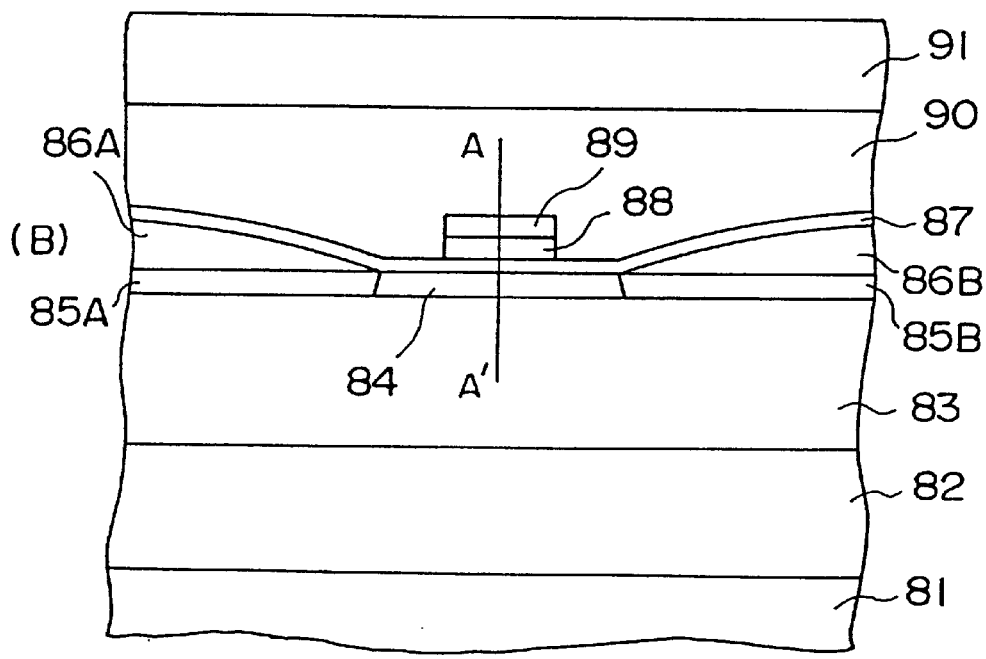

FIGS. 22A and 22B show the construction of a ferromagnetic tunnel-junction magnetic sensor 80 according to a sixth embodiment of the present invention respectively in a plan view and front view.

Figure 1:
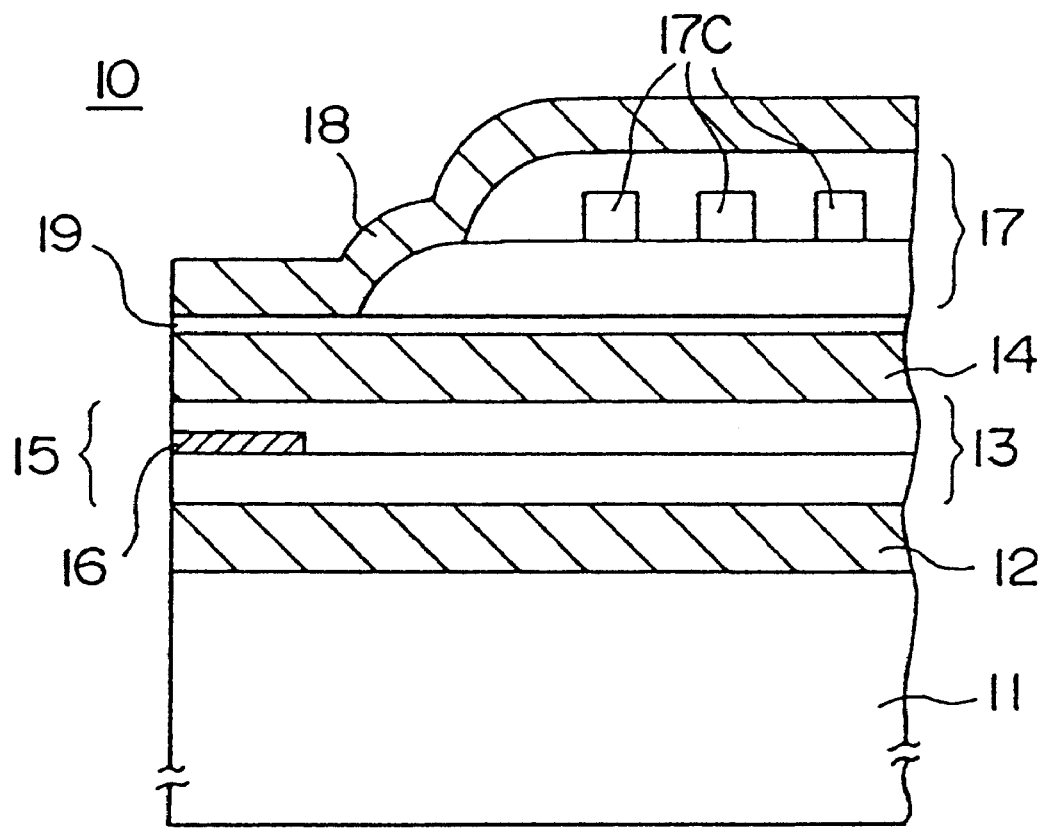
FIG. 1 is a diagram showing the construction of a conventional magnetic head.
Figure 2A:
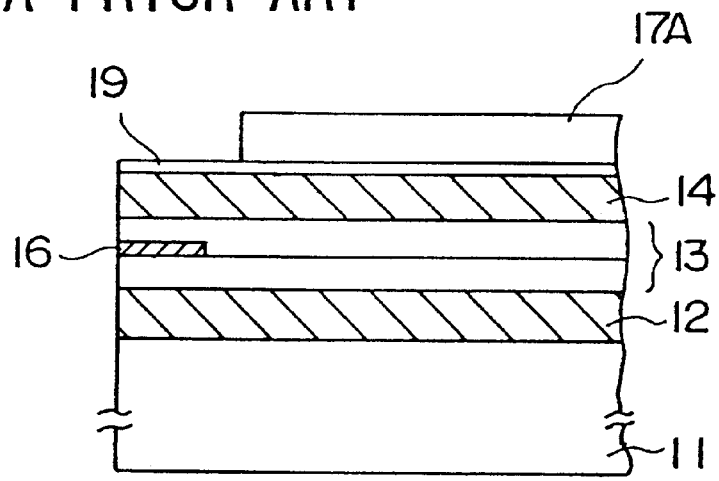
FIGS. 2A–2E are diagrams showing the fabrication process of the magnetic head of FIG. 1.
Figure 2B:
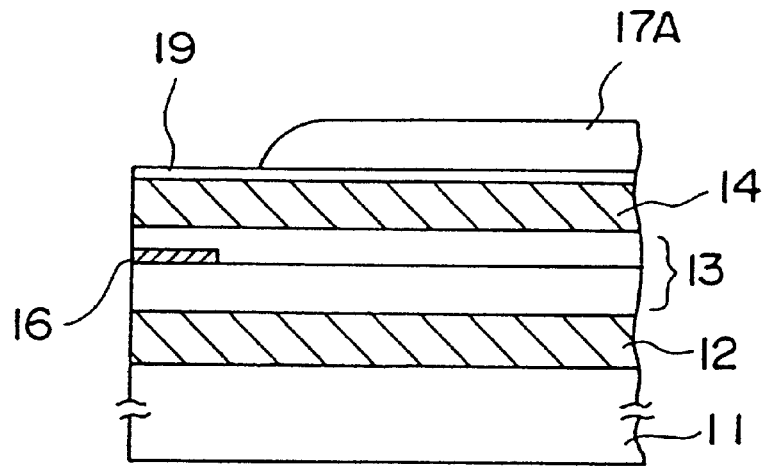
Figure 2C:
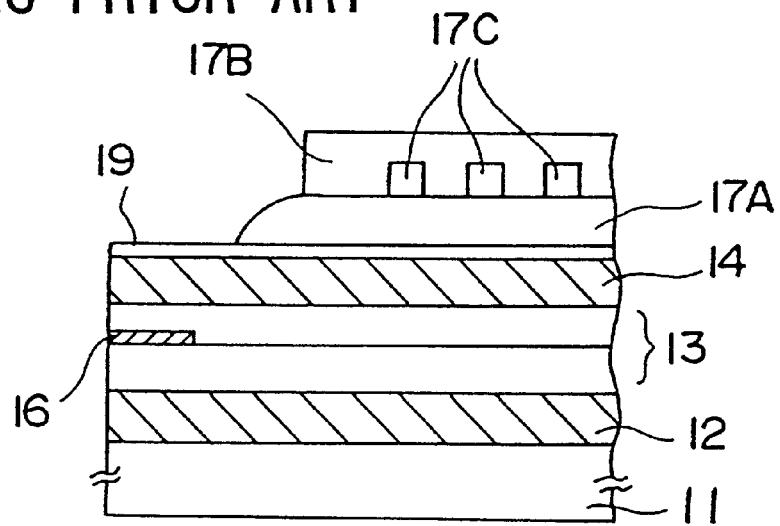
Figure 2D:
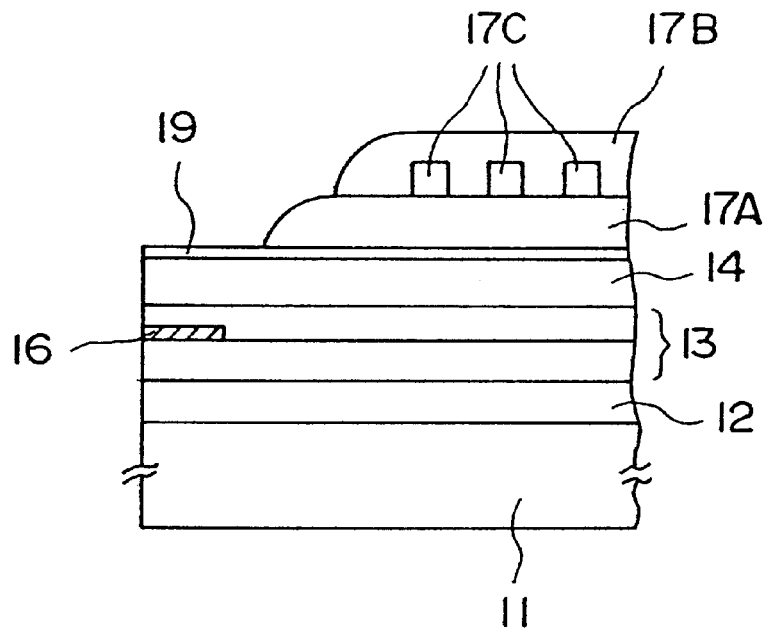
Figure 2E:
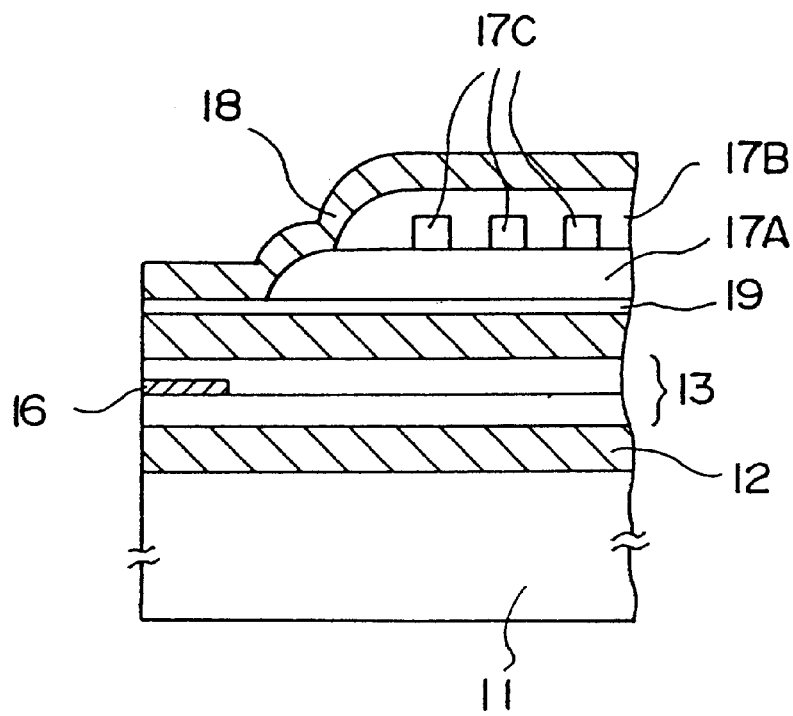

Referring to FIGS. 22A and 22B, the ferromagnetic tunnel-junction sensor 80 is formed on a substrate 81 of $Al_2O_3$.TiC and includes a lower magnetic shield layer 82 of NiFe or FeN corresponding to the lower magnetic shield layer 12 of the magnetic head 10 of FIG. 1, wherein a gap layer 83 is provided on the lower magnetic shield layer 82 in correspondence to the non-magnetic layer 13 of the magnetic head 10 of FIG. 1. On the $Al_2O_3$ gap layer 83, a lower ferromagnetic layer 84 with a pattern width WL of about 0.8 μm is provided. It should be noted that the lower ferromagnetic layer 84 corresponds to the ferromagnetic layer 30A of FIG. 11 or the ferromagnetic layer 40A of FIG. 15, and anti-ferromagnetic layers 85A and 85B of CoCrPt are formed at both lateral sides of the lower ferromagnetic layer 84 in a electrical contact therewith. The anti-ferromagnetic layers 85A and 85B are magnetized and magnetizing the intervening ferromagnetic layer 84 so that the ferromagnetic layer 84 includes a single magnetic domain.

On the anti-ferromagnetic layers 85A and 85B, there are provided electrode patterns 86A and 86B of Ta, Ti, Cu or W respectively, and an insulation barrier layer 87 corresponding to the insulation barrier layer 30C or 40C of the previous embodiment is provided so as to cover the electrode patterns 86A and 86B and the lower ferromagnetic layer 84. Further, an upper ferromagnetic layer 88 corresponding to the upper ferromagnetic layer 30B or 40B is provided on the insulation barrier layer 87 typically with a width WH of about 0.5 μm, and an upper electrode 89 of Ta, Ti, Cu or W is provided on the upper ferromagnetic layer 88.

Further, an $Al_2O_3$ layer 90 is deposited on the insulation barrier layer 87 so as to cover the upper ferromagnetic layers 88 and 89, and a magnetic shield 91 of NiFe is provided further thereon in correspondence to the upper magnetic shield 14 of FIG. 1.

As indicated in FIG. 22A, the magnetic sensor 80 incorporated in a magnetic head scans the surface of a magnetic recording medium 100 such as a magnetic disk and picks up the information signal recorded on the magnetic recording medium 100 in the form of magnetic spots. In the reading mode operation of such a magnetic head, a constant drive current is caused to flow from the electrode 86A to the upper electrode 89 or vice versa and a voltage appearing across the electrode 89 and the electrode 86B is detected. Alternatively, the voltage across the electrode 89 and the electrode 86A may be detected.

It should be noted that the magnetic sensor 80 may have a cross-sectional structure of any of the first through fifth embodiments for the cross section taken along a line A–A' of FIG. 22B.

SEVENTH EMBODIMENT

Figure 23A:
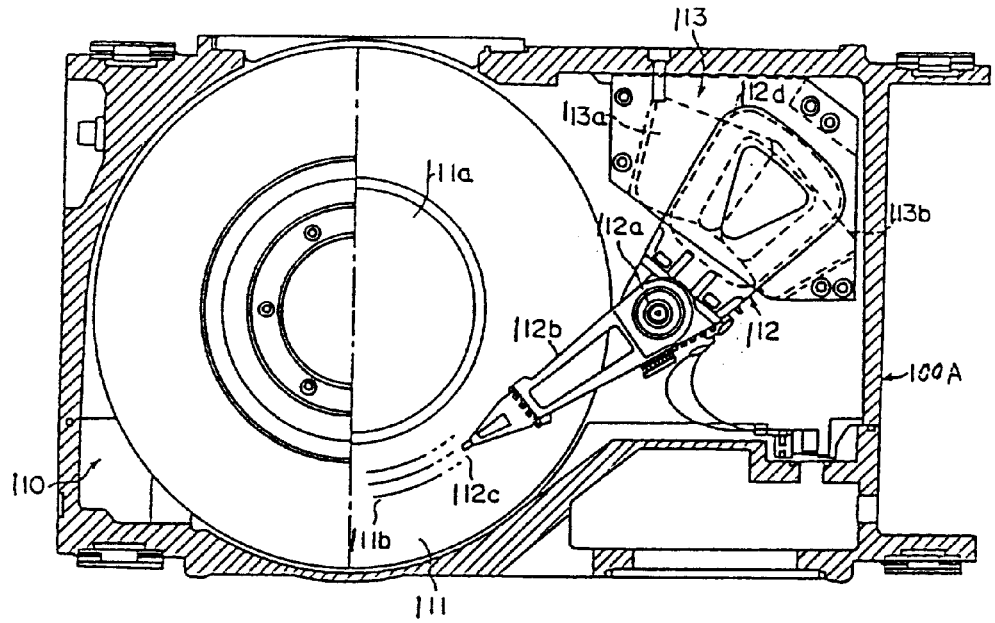
FIGS. 23A and 23B are diagrams showing the construction of a magnetic recording and reproducing apparatus having a magnetic head in which the ferromagnetic tunnel-junction magnetic head of the present invention is used.

FIG. 23A shows the internal structure of a hard disk drive according to a seventh embodiment of the present invention in a plan view, wherein the left side of the broken line shows the hard disk drive in a state wherein the upper cover is removed, while the right side of the broken line shows the construction of a magnetic disk 111 and an arm assembly 112 that cooperates with the disk 111, wherein the magnetic disk 111 and the arm assembly 112 form a part of a magnetic disk assembly 110 in which a plurality of magnetic disks are stacked with each other.

Referring to FIG. 23A, each magnetic disk 111 is mounted upon a hub 111a that is driven by a motor not illustrated, and the arm assembly 112 includes a swing arm 112b held on a swing axle 112a and a magnetic head 112c provided on a free end of the arm 112b. Further, a coil 112d that forms a part of a voice coil motor 113 is provided on the arm 112b in correspondence to another free end, opposite to the first free end on which the magnetic head 112c is provided, wherein the coil 112d is wound parallel to the scanning surface of the arm 112b. Further, magnets 113a and 113b forming another part of the voice coil motor 113 are disposed above and below the coil 112d. Thereby, the arm 112 is rotated about the swing axle 112a freely in response to the energization of the coil 112d. The voice coil motor 113 is subjected to servo control such that the magnetic head 112c carried on the arm 112b properly tracks a cylinder or track 111b that is defined on the magnetic disk 111.

Figure 23B:
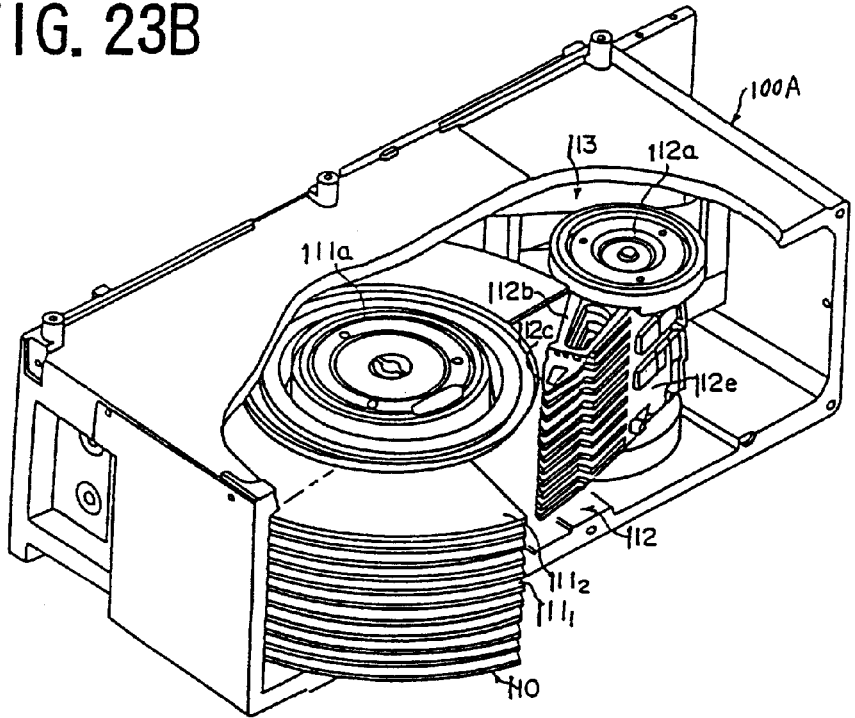

FIG. 23B is a perspective view showing the internal structure of the hard disk drive of FIG. 23A.

Referring to FIG. 23B, the magnetic disk assembly 110 includes a plurality of magnetic disks $111_1$, $111_2$, . . . that are held commonly on the rotary hub 111a, and the arm assembly 112 includes a plurality of arms corresponding to the plurality of magnetic disks. Each arm 112b is held on a common rotatable member 112e that in turn is held rotatable about the swing axle 112a, and all the arms 112b are swung simultaneously in response to the rotational motion of the member 112e. Of course, the member 112e is activated in response to the energization of the voice coil motor 113. Further, the entire structure of the hard disk device is accommodated within a hermetically sealed envelop 100A.

By using the ferromagnetic tunnel-junction magnetic sensor of any of the first through sixth embodiments for the read head of the magnetic head 112c, the hard disk drive can perform a very high-density recording and reproduction of information.

In any of the preceding embodiments, it should be noted that the metal used for forming the insulation barrier layer is by no means limited to Al but any of metal elements such as Nb, Hf or Zr may be used.

Further, the present invention is not limited to the embodiments described heretofore, but various variations and modifications may be made without departing from the scope of the invention.

What is claimed is:

1. A method of fabricating a ferromagnetic tunnel-junction magnetic sensor, said ferromagnetic tunnel-junction magnetic sensor including a first ferromagnetic layer, an insulation barrier layer including a tunnel oxide film and formed on said first ferromagnetic layer, and a second ferromagnetic layer formed on said insulation barrier layer, said method comprising the steps of:

forming an oxide film on a surface of said first ferromagnetic layer with a thickness that allows substantial tunneling of elections through said oxide film;

depositing a metal layer on said oxide film with a thickness larger than one molecular layer in terms of an oxide of the metal forming said metal layer;

forming said tunnel oxide film on said metal layer by oxidizing a surface of said metal layer; and forming said second ferromagnetic layer on said oxidized surface of said metal layer.

2. A method as claimed in claim 1, wherein said step of oxidizing said surface of said metal layer is conducted such that said metal layer remains underneath said tunnel oxide film, and wherein said method further includes the step, after said step of oxidizing said surface of said metal layer, of annealing said metal layer at a temperature of about 200° C.–300° C.

3. A method as claimed in claim 2, wherein said step of annealing is conducted at a temperature of about 300° C.

4. A method as claimed in claim 2, wherein said step of annealing is conducted in a vacuum environment.

5. A method as claimed in claim 1, wherein said step of forming said tunnel oxide film includes the step of naturally oxidizing said surface of said metal layer.

6. A method as claimed in claim 1, wherein said step of forming said tunnel oxide film includes the step of plasma-oxidation of said surface of said metal layer.

7. A method as claimed in claim 1, wherein said oxide film is formed by a plasma oxidation process.

\* \* \* \* \*